(12) United States Patent
Zhang et al.

(10) Patent No.: US 9,823,028 B2
(45) Date of Patent: Nov. 21, 2017

(54) WATER COOLING DEVICE WITH DETACHABLY ASSEMBLED MODULARIZED UNITS

(71) Applicant: ASIA VITAL COMPONENTS CO., LTD., New Taipei (TW)

(72) Inventors: Rong-Xian Zhang, New Taipei (TW); Jian-Wu Yin, New Taipei (TW)

(73) Assignee: ASIA VITAL COMPONENTS CO., LTD., New Taipei (TW)

(*) Notice: Subject to any disclaimer, the term of this patent is extended or adjusted under 35 U.S.C. 154(b) by 171 days.

(21) Appl. No.: 14/804,303

(22) Filed: Jul. 20, 2015

(65) Prior Publication Data

US 2017/0023317 A1   Jan. 26, 2017

(51) Int. Cl.
| | |
|---|---|
| F28D 15/00 | (2006.01) |
| F28F 9/26 | (2006.01) |
| F28F 3/02 | (2006.01) |
| F28F 13/06 | (2006.01) |

(52) U.S. Cl.
CPC ............... *F28F 9/26* (2013.01); *F28D 15/00* (2013.01); *F28F 3/02* (2013.01); *F28F 13/06* (2013.01)

(58) Field of Classification Search
CPC ...... F28F 9/26; F28F 3/02; F28F 13/06; F28D 15/00
USPC ................................................ 165/104.31
See application file for complete search history.

(56) References Cited

U.S. PATENT DOCUMENTS

| | | | | |
|---|---|---|---|---|
| 3,478,821 A | * | 11/1969 | Fieni ............... | B60H 1/00328 165/151 |
| 5,101,886 A | * | 4/1992 | Zacharias ........... | F01N 5/02 165/51 |
| 8,245,764 B2 | | 8/2012 | Eriksen | |
| 2004/0057211 A1 | * | 3/2004 | Kondo ............... | G06F 1/20 361/696 |
| 2004/0125561 A1 | * | 7/2004 | Gwin ................ | G06F 1/20 361/699 |
| 2009/0252607 A1 | * | 10/2009 | Hein ................. | F04D 29/043 415/229 |

* cited by examiner

*Primary Examiner* — Davis Hwu
(74) *Attorney, Agent, or Firm* — Jackson IPG PLLC; Demian K. Jackson

(57) ABSTRACT

A water cooling device with detachably assembled modularized units includes at least one modularized pump unit and at least one modularized heat exchange unit. Different number of the modularized heat exchange unit can be detachably assembled to the modularized pump unit according to the number of heat sources to be cooled.

10 Claims, 19 Drawing Sheets

WATER COOLING DEVICE WITH DETACHABLY ASSEMBLED MODULARIZED UNITS

FIELD OF THE INVENTION

The present invention relates to a water cooling device, and more specifically, to a water cooling device having at least one modularized pump unit and at least one modularized heat exchange unit that can be detachably assembled to one another, so that the water cooling device can have different number of the heat exchange units connected to the pump unit according to the number of heat sources to be cooled, and any damaged one of the modularized units of the cooling device can be replaced quickly and easily.

BACKGROUND OF THE INVENTION

During the operation of an electronic device, heat produced by electronic elements, such as a central processing unit (CPU), in the electronic device must be quickly and effectively dissipated into the ambient air. Currently, an air cooling device consisting of heat radiators and cooling fans is most widely used to dissipate the heat produced by the CPU or other electronic elements in the electronic device. Another common way to cool the CPU or other electronic elements in the electronic device is using a cooling liquid. U.S. Pat. No. 8,245,764 discloses a cooling system for a heat-generating component. The cooling system includes a double-sided chassis, a reservoir and a heat radiator. The double-sided chassis is designed for mounting a pump thereto to circulate a cooling liquid. The pump includes a stator and an impeller. The impeller is positioned on a bottom side of the chassis, whereas the stator is positioned on an upper side of the chassis and isolated from the cooling liquid. The reservoir is designed for passing the cooling liquid therethrough and includes a pump chamber, a heat exchange chamber and a heat-exchanging interface. The pump chamber includes the impeller and is formed below the chassis, and the pump chamber is defined by at least one impeller cover having one or more passages for the cooling liquid to pass through. The heat exchange chamber is formed below the pump chamber and vertically spaced apart from the pump chamber. The pump chamber and the heat exchange chamber are two separate chambers that are fluidly coupled together by the one or more passages. The heat-exchanging interface forms a side wall of the heat exchange chamber and is in contact with a surface of the heat-generating component. The heat radiator is fluidly coupled to the reservoir to dissipate heat from the cooling liquid. However, the above-described conventional cooling system has a large number of components mounted onto the only one double-sided chassis and two vertically spaced chambers must be formed below the chassis, causing the double-sided chassis to have a largely increased overall height. Besides, it is difficult to assemble or disassemble the conventional cooling system due to the large number of components thereof.

It is therefore tried by the inventor to develop an improved water cooling device with detachably assembled modularized units to overcome the above problems.

SUMMARY OF THE INVENTION

To solve the above problems, a primary object of the present invention is to provide a water cooling device that includes at least one modularized pump unit and at least one modularized heat exchange unit, such that the pump unit can be detachably assembled to different number of the heat exchange units according to the number of heat sources to be cooled.

Another object of the present invention is to provide a water cooling device that includes detachably assembled modularized units, such that any damaged modularized unit can be replaced alone in a convenient and quick manner to lower the use cost of the water cooling device.

To achieve the above and other objects, the water cooling device provided according to the present invention includes at least one modularized pump unit and at least one modularized heat exchange unit, such that the pump unit can be detachably assembled to different number of the heat exchange units according to the number of heat sources to be cooled, and any damaged modularized unit can be replaced alone in a convenient and quick manner to lower the use cost of the water cooling device.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
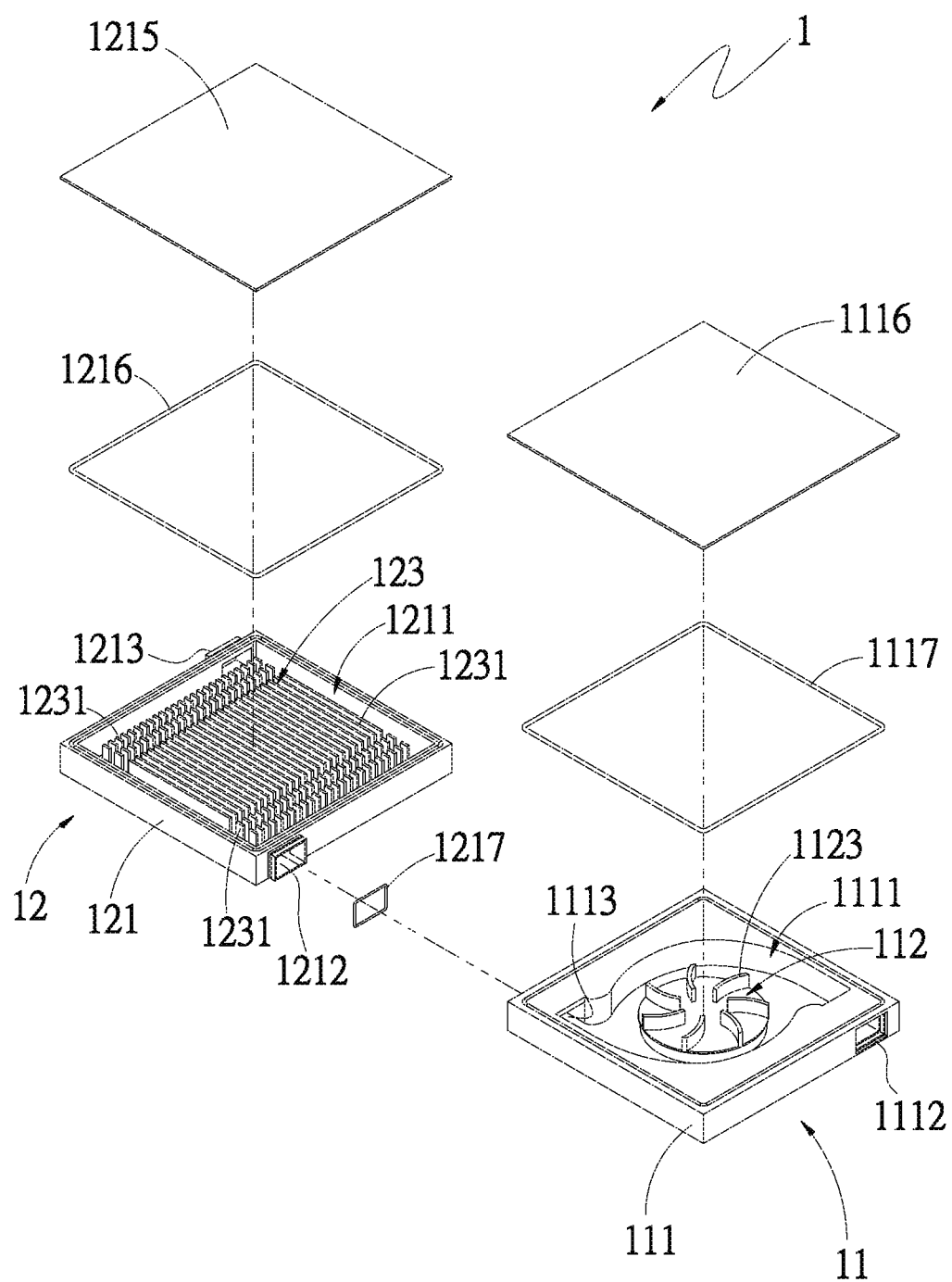
FIG. 1 is an exploded perspective view of a water cooling device according to a first embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 2:
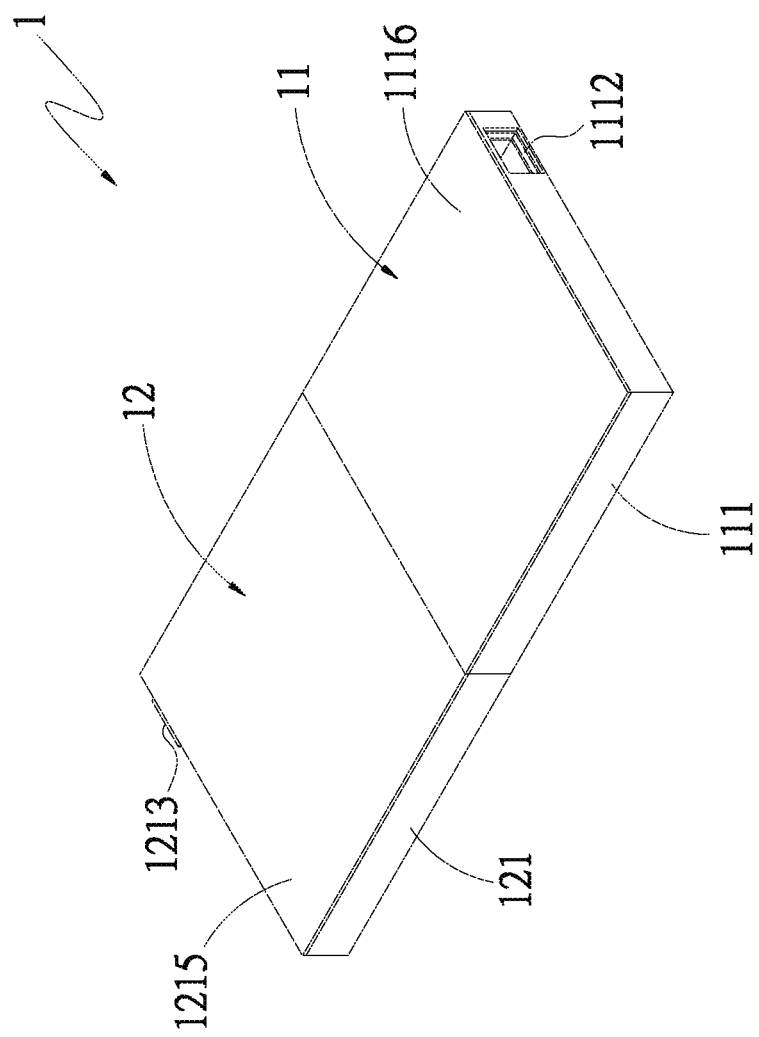
FIG. 2 is an assembled perspective view of FIG. 1.
Figure 3A:
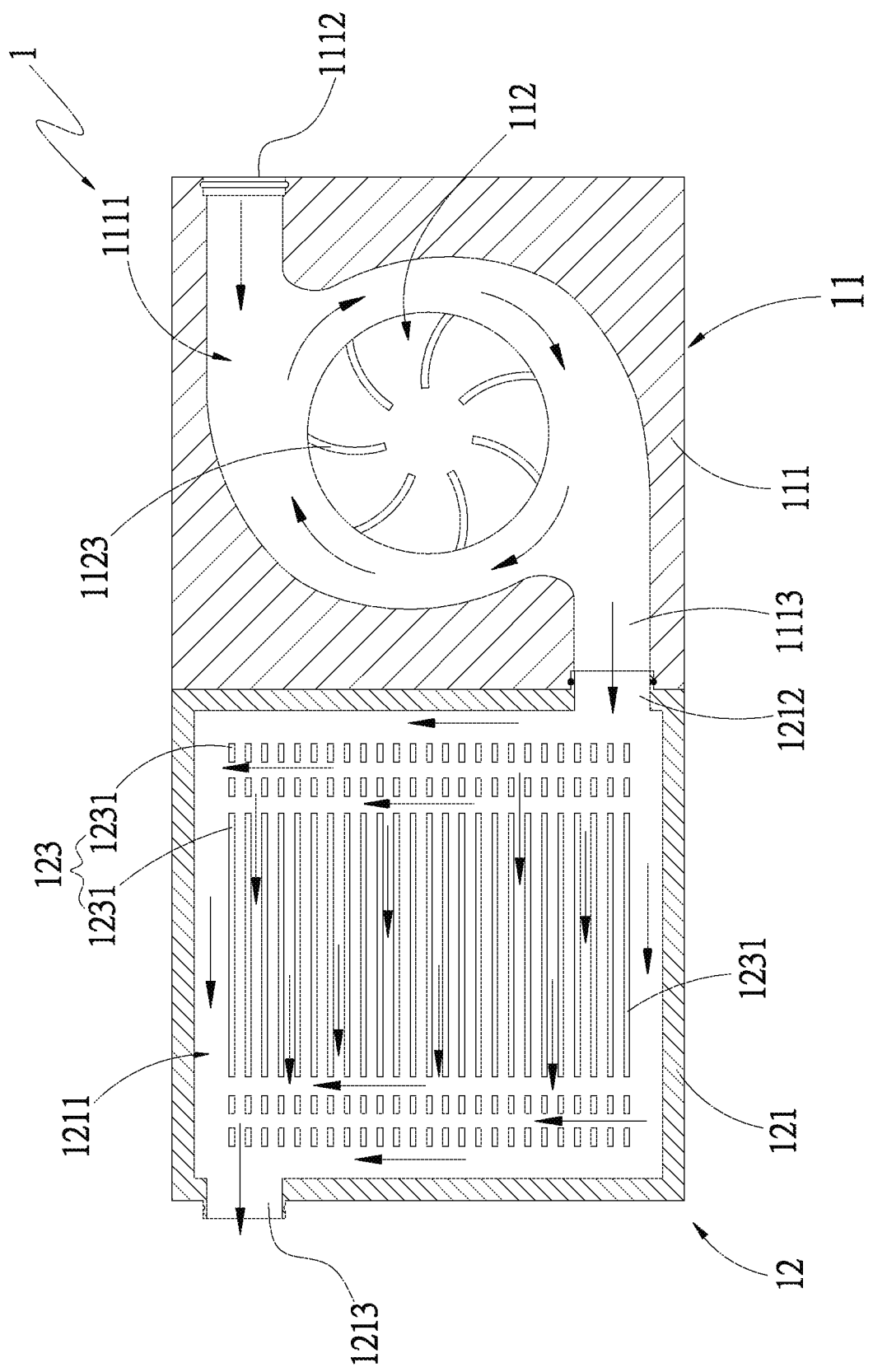
FIG. 3A is an assembled sectional top view of the water cooling device of FIG. 1.
Figure 3B:
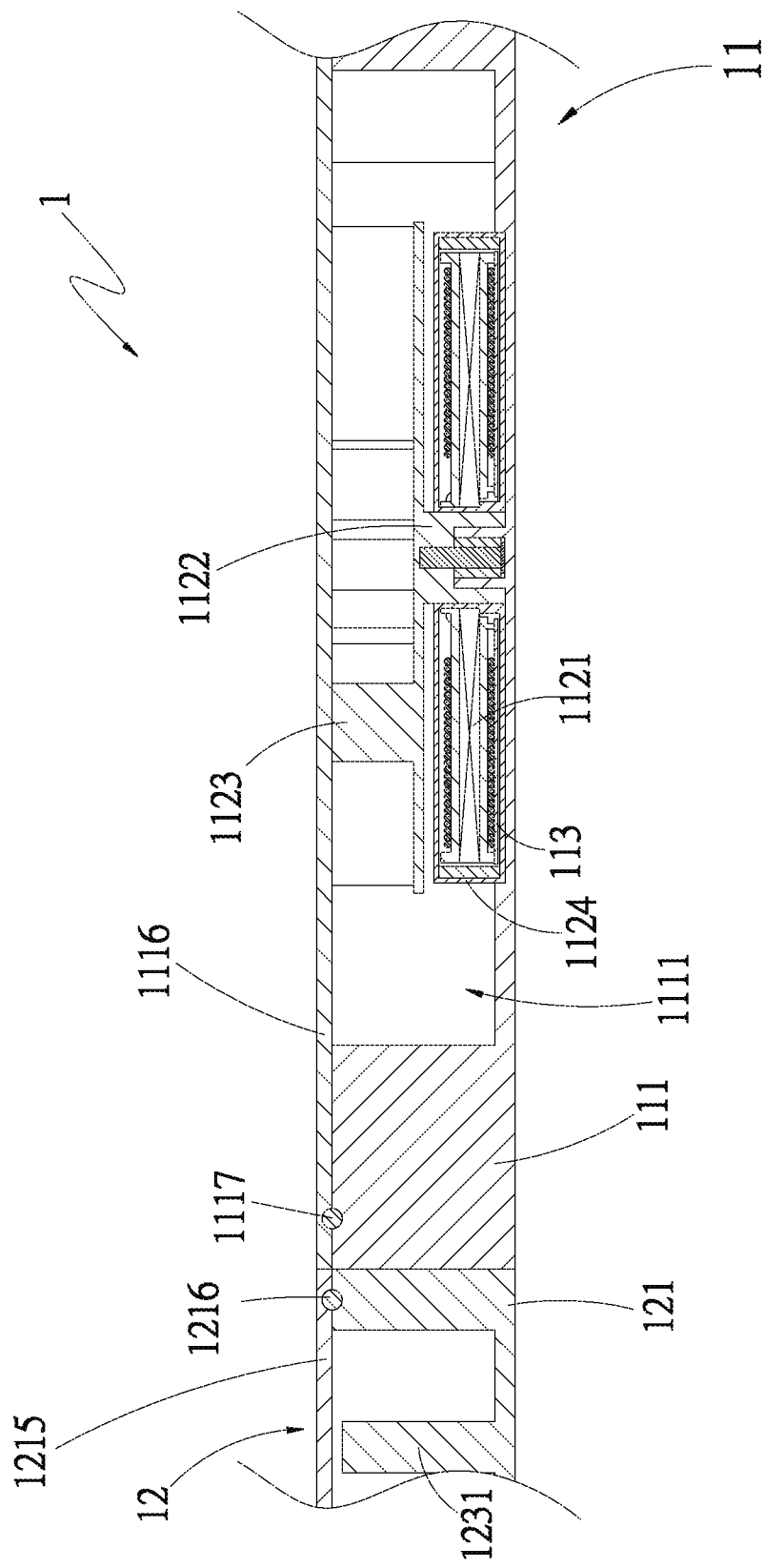
FIG. 3B is a fragmentary sectional side view of the water cooling device of FIG. 1.

Please refer to FIGS. 1 and 2, which are exploded and assembled perspective views, respectively, of a water cooling device with detachably assembled modularized units according to a first embodiment of the present invention, and to FIGS. 3A and 3B, which are sectional top and side views, respectively, of the water cooling device of FIG. 1. For the purpose of conciseness, the present invention is also briefly referred to as the water cooling device herein and generally denoted by reference numeral 1. As shown, the water cooling device 1 includes at least one modularized pump unit 11 and at least one modularized heat exchange unit 12, such that the heat exchange unit 12 and the pump unit 11 can be detachably assembled to one another. The pump unit 11 has a pump housing 111 and a pump 112. The pump housing 111 internally defines a pump chamber 1111 and has an inlet 1112, a first outlet 1113, and a first top plate 1116 connected to an upper side of the pump housing 111. In the illustrated first embodiment, the first top plate 1116 and the pump housing 111 are two separate elements and can be connected to each other by scarf joining, screw locking, gluing, welding or the like. A first packing 1117 is provided between the first top plate 1116 and the pump housing 111 to prevent a cooling liquid in the pump chamber 1111 from leaking out of the pump housing 111. In practical implementation, however, the first top plate 1116 can be integrally formed with the pump housing 111 to save the first packing 1117.

Both the inlet 1112 and the first outlet 1113 of the pump housing 111 are communicable with the pump chamber 1111. In the illustrated first embodiment, the inlet 1112 and the first outlet 1113 of the pump housing 111 are recessed into two opposite side walls of the pump housing 111. In other embodiments, however, the inlet 1112 and the first outlet 1113 of the pump housing 111 can be protruded from two opposite side walls of the pump housing 111. The pump chamber 1111 is designed for the cooling liquid to pass therethrough. The pump 112 is positioned in the pump chamber 1111 and submerged in the cooling liquid to circulate the cooling liquid in the pump chamber 1111. The pump 112 has a stator 1121, a rotor 1122, and an impeller 1123. The rotor 1122 is connected to the impeller 1123, which is exposed to the cooling liquid in the pump chamber 1111. The stator 1121 is enclosed in an isolating case 1124 and isolated from the cooling liquid in the pump chamber 1111. The stator 1121 enclosed in the isolating case 1124 is located corresponding to the rotor 1122 to drive the latter and accordingly the impeller 1123 to rotate. The rotating impeller 1123 in turn stirs the cooling liquid in the pump chamber 1111, causing the cooling liquid to flow from the inlet 1112 toward the first outlet 1113 into the heat exchange unit 12.

In practical implementation, the number of the outlets of the pump housing 111 can be determined in advance according to the number of heat sources to be cooled. For example, on one of the four side walls of the pump housing 111, one protruded inlet 1112 can be provided to communicate with the pump chamber 1111, while three protruded outlets can be provided on the other three side walls of the pump housing 111 to communicate with the pump chamber 1111. Also, the number of the outlets of the pump housing 111 is corresponding to that of the heat exchange units 12. For example, the pump housing 111 may have three outlets for connecting to three heat exchange units. With these arrangements, different number of the modularized heat exchange units 12 can be detachably assembled to the modularized pump unit 11 to form the water cooling device 1 according to the number of the heat sources to be cooled, such as the central processing unit (CPU) and the Graphics Processing Unit (GPU), in an electronic device, such as a computer (not shown). For example, there are two heat sources, a CPU and a GPU, in the electronic device. In this case, two outlets of the pump unit 11 are connected to two heat exchange units 12, which are respectively attached to the CPU and the GPU to cool them. Therefore, the modularized pump unit and heat exchange unit forming the water cooling device 1 of the present invention can be flexibly changed in number according to the number of the heat sources to be cooled, and the water cooling device 1 can therefore be expanded flexibly.

Also, the stator 1121 of the pump 112 is electrically connected to a printed circuit board (PCB), which has a plurality of electronic elements provided thereon. In the illustrated first embodiment, the PCB 113 is located in the isolating case 1124, and has a plurality of electric wires extended through the isolating case 1124 and the pump housing 111 to connect to an external power supply (not shown), so as to obtain electrical energy for generating a magnetic field. In other embodiments of the present invention that are not illustrated in the accompanying drawings, the PCB 113 can be disposed on an outer surface of the pump housing 111 with the electric wires of the PCB 113 extended through the pump housing 111 and the isolating case 1124 to connect to the stator 1121. In addition, positions on the pump housing 111 and the isolating case 1124, at where the electronic wires of the PCB 113 are extended through, are sealed to prevent the cooling liquid from flowing into the isolating case 1124 and leaking out of the pump housing 111.

The heat exchange unit 12 is detachably connected to one side of the pump unit 11, so that the heat exchange unit 12 and the pump unit 11 are horizontally positioned side by side. The heat exchange unit 12 includes a liquid case 121 and a heat dissipation member 123. The liquid case 121 internally defines a heat exchange chamber 1211 and has a water inlet 1212, a water outlet 1213, and a second top plate 1215 formed on an upper side of the liquid case 121. In the illustrated first embodiment, the second top plate 1215 and the liquid case 121 are two separate elements and can be connected to each other by scarf joining, screw locking, gluing, welding or the like. A second packing 1216 is provided between the second top plate 1215 and the liquid case 121 to prevent the cooling liquid in the heat exchange chamber 1211 from leaking out of the liquid case 121. In practical implementation, however, the second top plate 1215 can be integrally formed with the liquid case 121 to save the second packing 1216.

The water inlet 1212 is communicable with the heat exchange chamber 1211 and the water outlet 1213, and can be communicably connected to the first outlet 1113 of the pump housing 111, so that the cooling liquid in the pump housing 111 can flow through the first outlet 1113 of the pump housing 111 and the water inlet 1212 of the liquid case 121 into the heat exchange chamber 1211. Thereafter, the cooling liquid flows through the heat dissipation member 123 and out of the liquid case 121 via the water outlet 1213. In the illustrated first embodiment, the water inlet 1212 and the water outlet 1213 of the liquid case 121 are protruded outwardly from two opposite side walls of the liquid case 121. Further, the water inlet 1212 of the liquid case 121 is correspondingly detachably connected to the first outlet 1113 of the pump housing 111. That is, since the pump unit 11 and the heat exchange unit 12 are modularized units, they can be assembled to one another to form the water cooling device 1 by detachably fitting or inserting the water inlet 1212 of the liquid case 121 into the first outlet 1113 of the pump housing 111. In the event any one of the pump unit 11 and the heat exchange unit 12 of the water cooling device 1 is damaged, only the damaged unit, for example, the pump unit 11, is needed to be replaced. In this case, the damaged pump unit 11 can be quickly disassembled from the water cooling device 1 and then a new one can be easily assembled to the original heat exchange unit 12 without the need of discarding the whole water cooling device 1. In this manner, the water cooling device can have largely reduced use cost and the modularized units thereof can be quickly easily replaced and reassembled.

Moreover, in other embodiments, the water inlet 1212 and the water outlet 1213 of the liquid case 121 can be recessed into two opposite side walls of the liquid case 121, and the water inlet 1212 of the liquid case 121 is correspondingly detachably connected to the first outlet 1113 of the pump housing 111. In other words, when the water inlet 1212 of the liquid case 121 is recessed in form, the first outlet 1113 of the pump housing 111 must be correspondingly protruded in form, such that the first outlet 1113 of the pump housing 111 can be inserted into the water inlet 1212 of the liquid case 121 to connect the pump unit 11 to the heat exchange unit 12. A first leak-proof packing 1217 is provided between the water inlet 1212 of the liquid case 121 and the first outlet 1113 of the pump housing 111 to prevent the cooling liquid in the pump chamber 1111 and the heat exchange chamber 1211 from leaking out of the two chambers at the joint of the water inlet 1212 and the first outlet 1113.

Referring to FIGS. 1 and 3A again, the heat exchange chamber 1211 allows the cooling liquid to flow therethrough and has the heat dissipation member 123 disposed therein. The heat dissipation member 123 is made of a metal material, such as copper or aluminum, and has a plurality of heat radiation fins 1231. The heat radiation fins 1231 are spaced on a bottom of the liquid case 121 in the heat exchange chamber 1211 to provide a largely increased heat exchange area. A heat contact surface is formed on an outer surface of the liquid case 121 for contacting with a heat source, such as a CPU or a GPU, such that heat produced by the heat source is absorbed by and transferred from the heat contact surface to the heat radiation fins 1231 in the heat exchange chamber 1211 for exchanging heat with the cooling liquid. At this time, the cooling liquid carries the heat away from the heat radiation fins 1231 and then flows out of the heat exchange chamber 1211 via the water outlet 1213 of the liquid case 121 to achieve the cooling effect.

While the heat radiation fins 1231 of the heat dissipation member 123 shown in FIG. 1 are different in height, it is understood the heat radiation fins 1231 may be designed to have the same height in practical implementation of the present invention.

With the detachably connectable modularized pump unit 11 and modularized heat exchange unit 12, the water cooling device 1 can be conveniently and quickly assembled and disassembled to enable efficient replacement of any damaged modularized unit and flexible expansion of the water cooling device.

In addition, in the present invention, the pump unit 11 and the heat exchange unit 12 are horizontally detachably connected side by side, which largely reduces an overall height of the heat exchange unit 12 and the pump unit 11 to effectively make the water cooling device 1 thinner.

Figure 4:
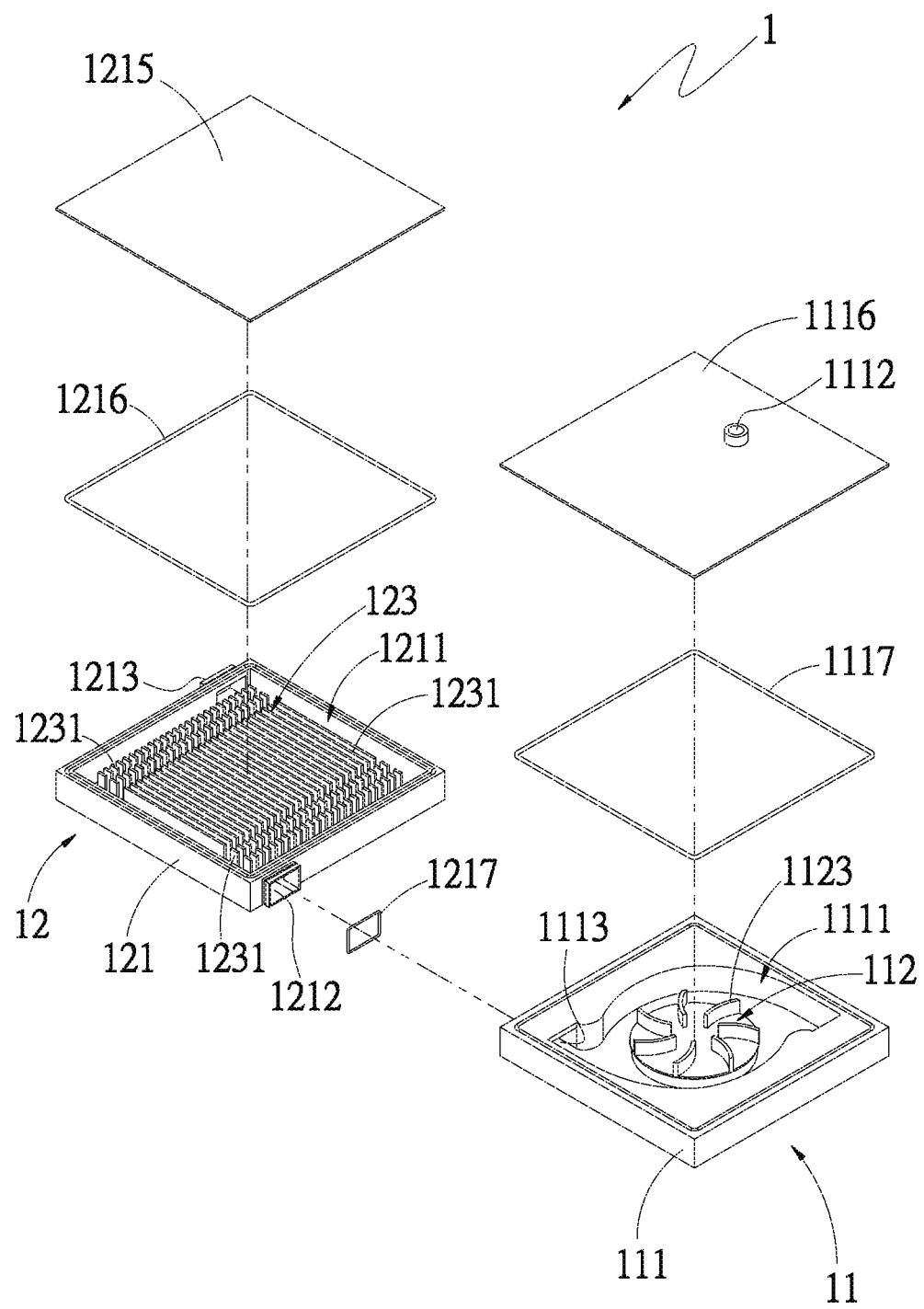
FIG. 4 is an exploded perspective view of the water cooling device according to a second embodiment of the present invention.
Figure 5:
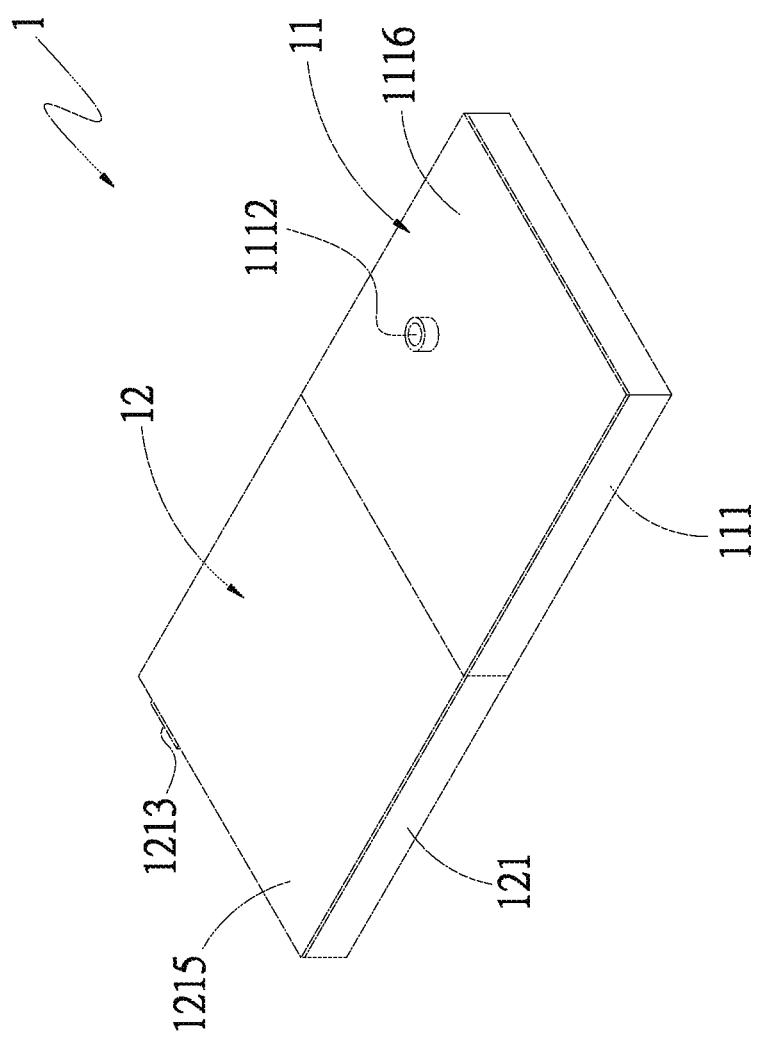
FIG. 5 is an assembled perspective view of FIG. 4.

FIGS. 4 and 5 are exploded and assembled perspective views, respectively, of the water cooling device 1 according to a second embodiment of the present invention. Please refer to FIGS. 4 and 5 along with FIG. 3A. The second embodiment of the water cooling device is generally structurally similar to the first embodiment except that, in the second embodiment, the inlet 1112 of the pump housing 111 of the pump unit 11 is protruded in form and provided on a top of the pump housing 111, i.e. the inlet 1112 is upward protruded from the top of the pumping housing 111. The first outlet 1113 is still recessed in form and provided on one side wall of the pump housing 111, and the water inlet 1212 and the water outlet 1213 are still protruded in form to outwardly protrude from two opposite side walls of the liquid case 121, such that the water inlet 1212 can still be correspondingly detachably connected to the first inlet 1113 of the pump housing 111.

With the detachably connectable modularized pump unit 11 and modularized heat exchange unit 12, the water cooling device 1 can be conveniently and quickly assembled and disassembled to enable efficient replacement of any damaged modularized unit and flexible expansion of the water cooling device.

Figure 6:
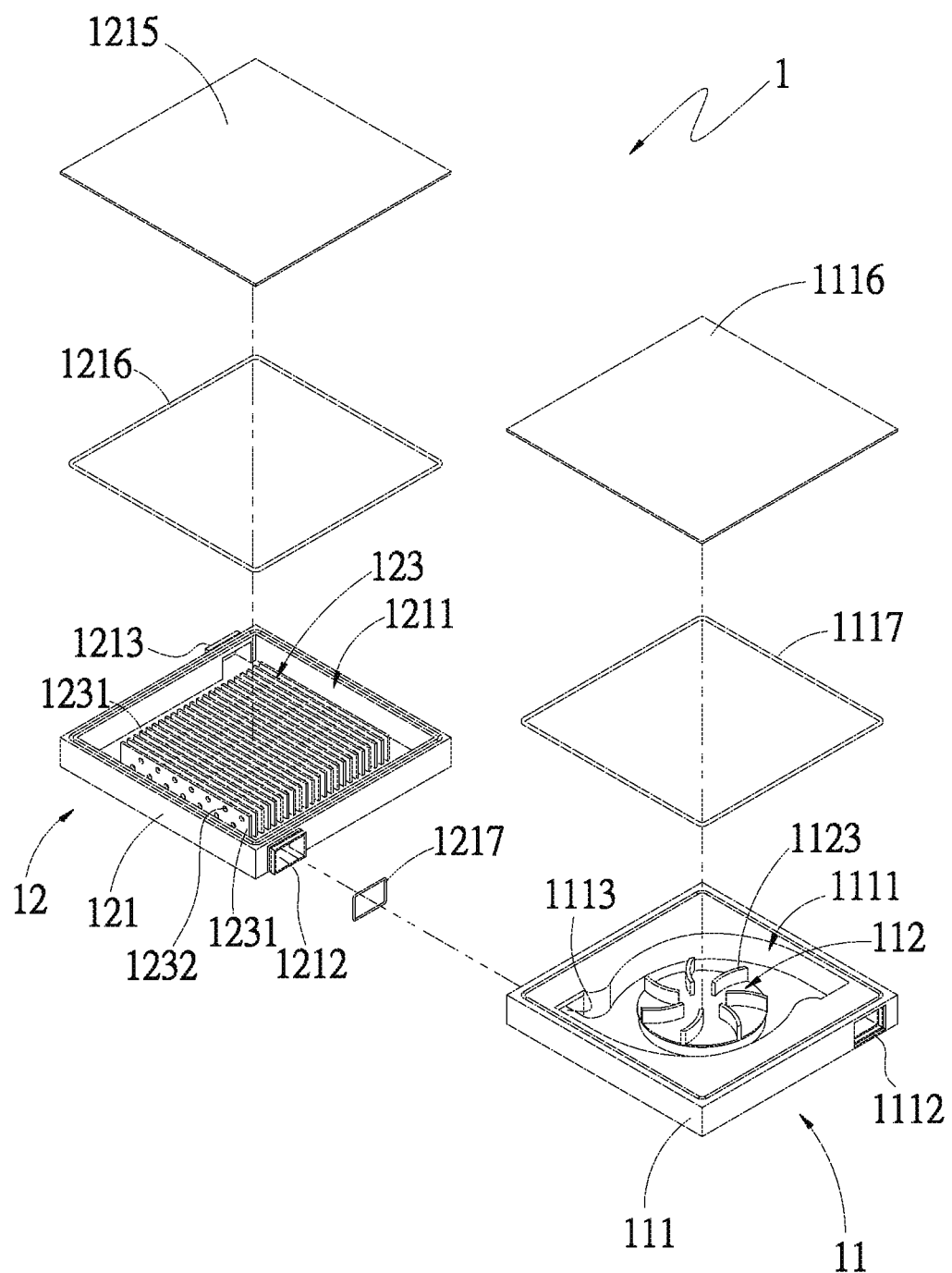
FIG. 6 is an exploded perspective view of the water cooling device according to a third embodiment of the present invention.
Figure 7:
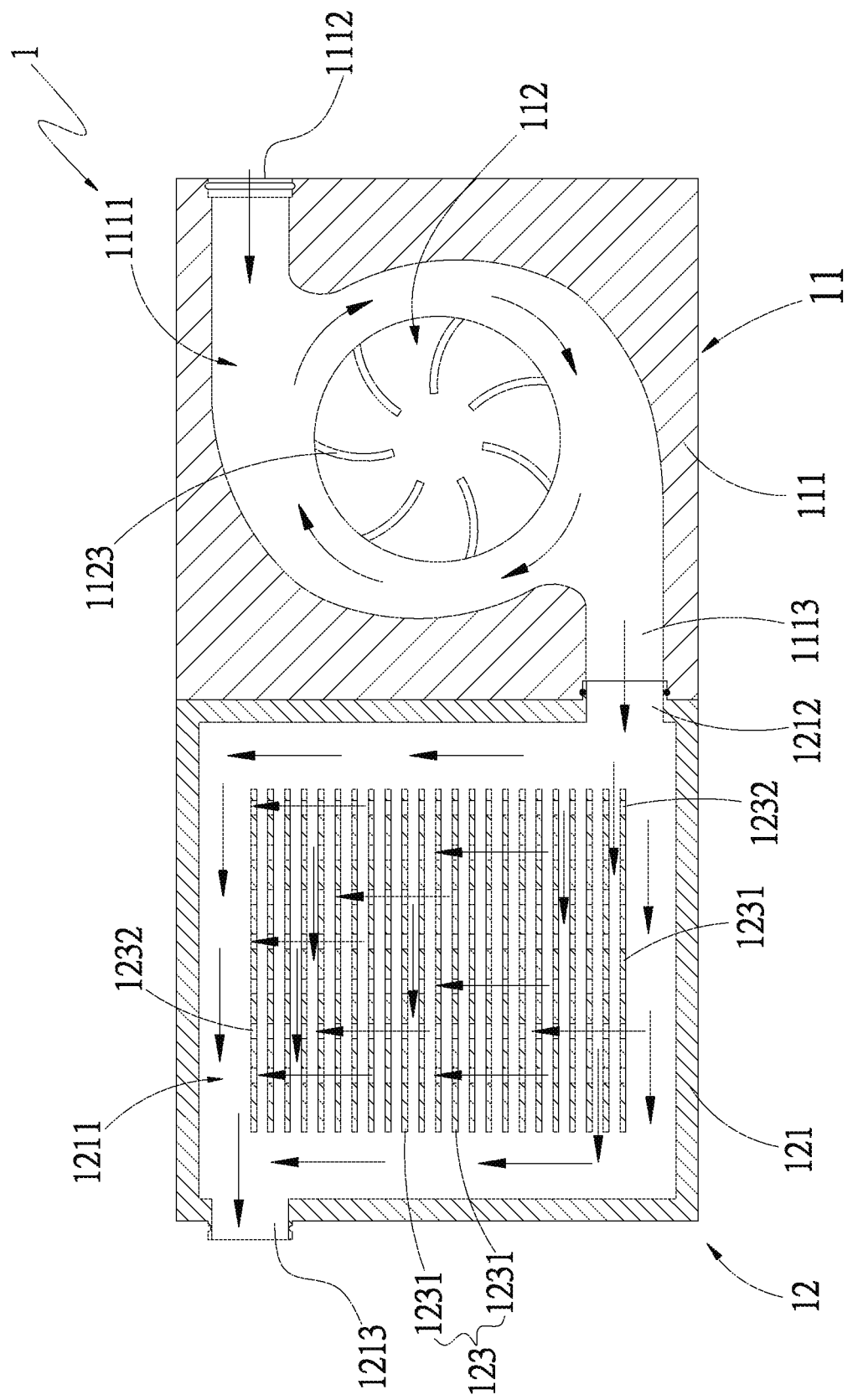
FIG. 7 is an assembled sectional top view of the water cooling device of FIG. 6.

Please refer to FIG. 6, which is an exploded perspective view of the water cooling device 1 according to a third embodiment of the present invention, and to FIG. 7, which is an assembled sectional top view of the water cooling device 1 of FIG. 6. The third embodiment of the water cooling device 1 is generally structurally similar to the first embodiment except that, in the third embodiment, each of the heat radiation fins 1231 has a plurality of through holes 1232 formed thereon to extend through the heat radiation fin 1231 in a thick direction thereof. The through holes 1232 are communicable with one another apart from being communicable with the heat exchange chamber 1211. With the through holes 1232, the heat radiation fins 1231 can have a largely increased contact area with the cooling liquid.

Figure 8:
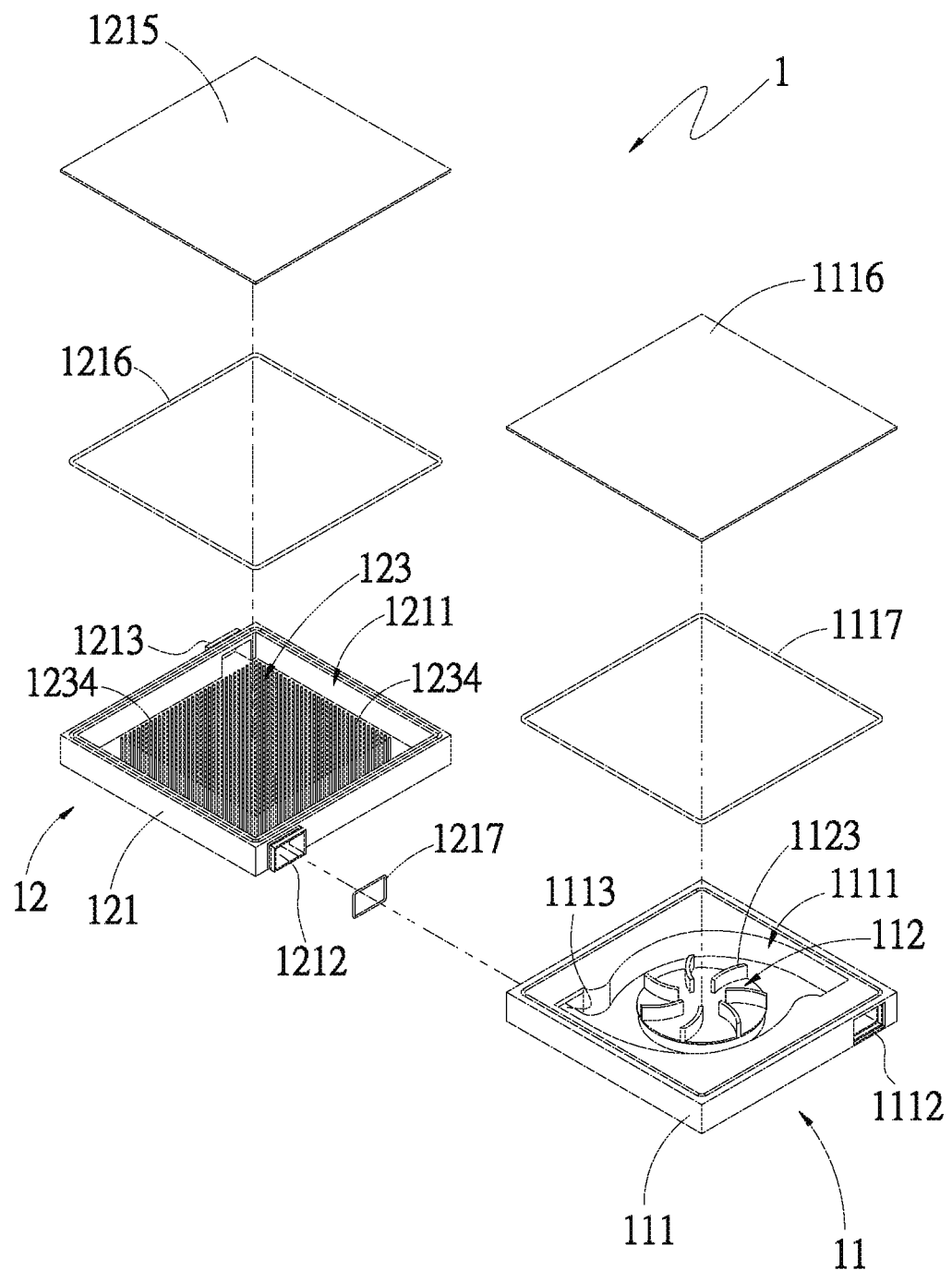
FIG. 8 is an exploded perspective view of the water cooling device according to a fourth embodiment of the present invention.
Figure 9:
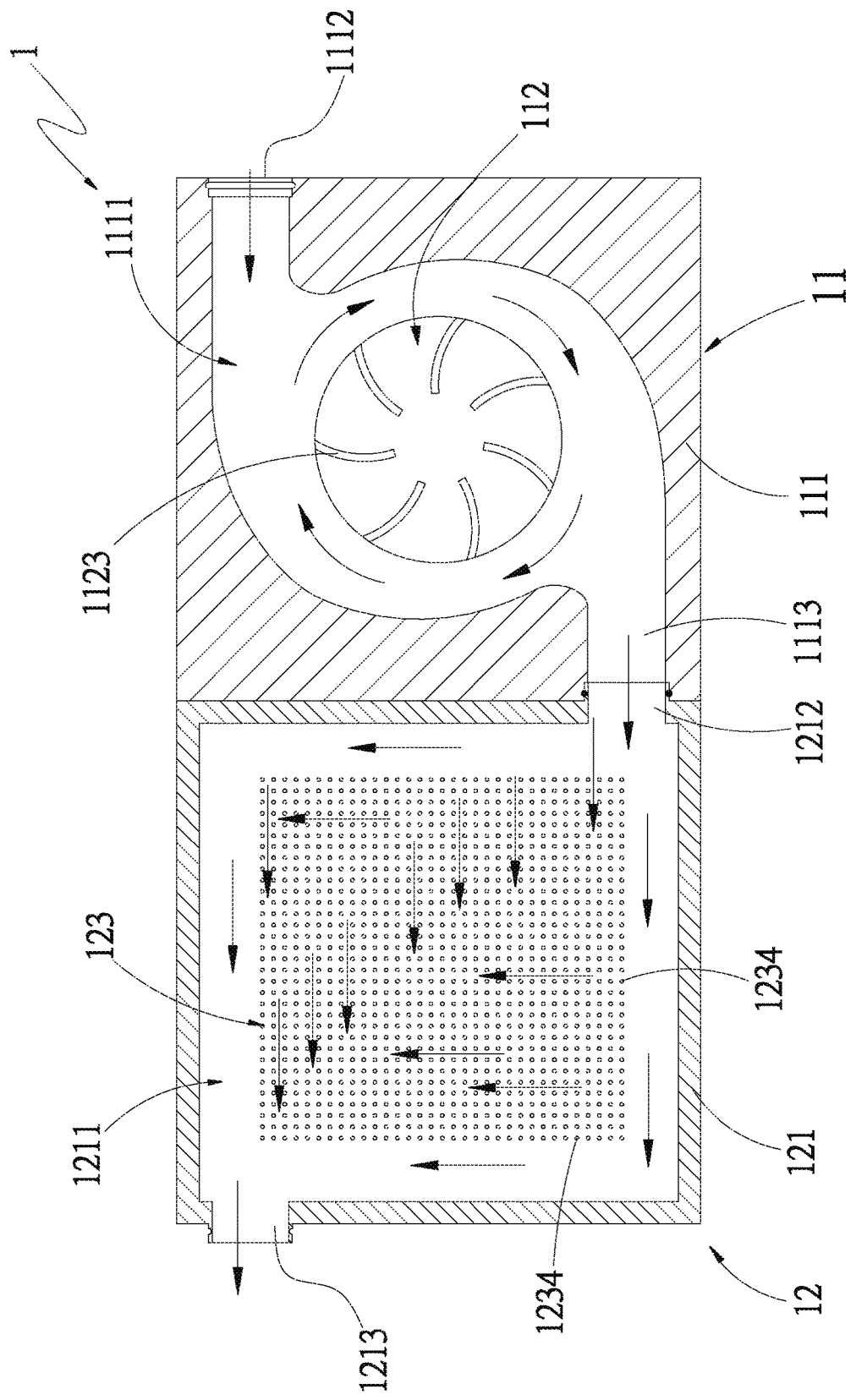
FIG. 9 is an assembled sectional top view of the water cooling device of FIG. 8.

Please refer to FIG. 8, which is an exploded perspective view of the water cooling device 1 according to a fourth embodiment of the present invention, and to FIG. 9, which is an assembled sectional top view of the water cooling device 1 of FIG. 8. The fourth embodiment of the water cooling device 1 is generally structurally similar to the first embodiment except that, in the fourth embodiment, the heat dissipation member 123 has a plurality of heat radiation posts 1234, which are arrayed on a bottom of the liquid case 121 to space from one another in the heat exchange chamber 1211. When the bottom of the liquid case 121 is attached to a heat source, such as a CPU, the heat produced by the heat source is absorbed by the bottom of the liquid case 121 and transferred to the heat radiation posts 1234 in the heat exchange chamber 1211 for exchanging heat with the cooling liquid. At this time, the cooling liquid flowing through the water inlet 1212 into the liquid case 121 further flows through the heat dissipation member 123 to quickly carry heat away from the heat radiation posts 1234 and then flows out of the heat exchange chamber 1211 via the water outlet 1213 of the liquid case 121 to achieve the cooling effect. With the detachably connectable modularized pump unit 11 and modularized heat exchange unit 12, the water cooling device 1 can be conveniently and quickly assembled and disassembled to enable efficient replacement of any damaged modularized unit thereof, and be flexibly expanded according to actual need in heat dissipation.

Figure 10:
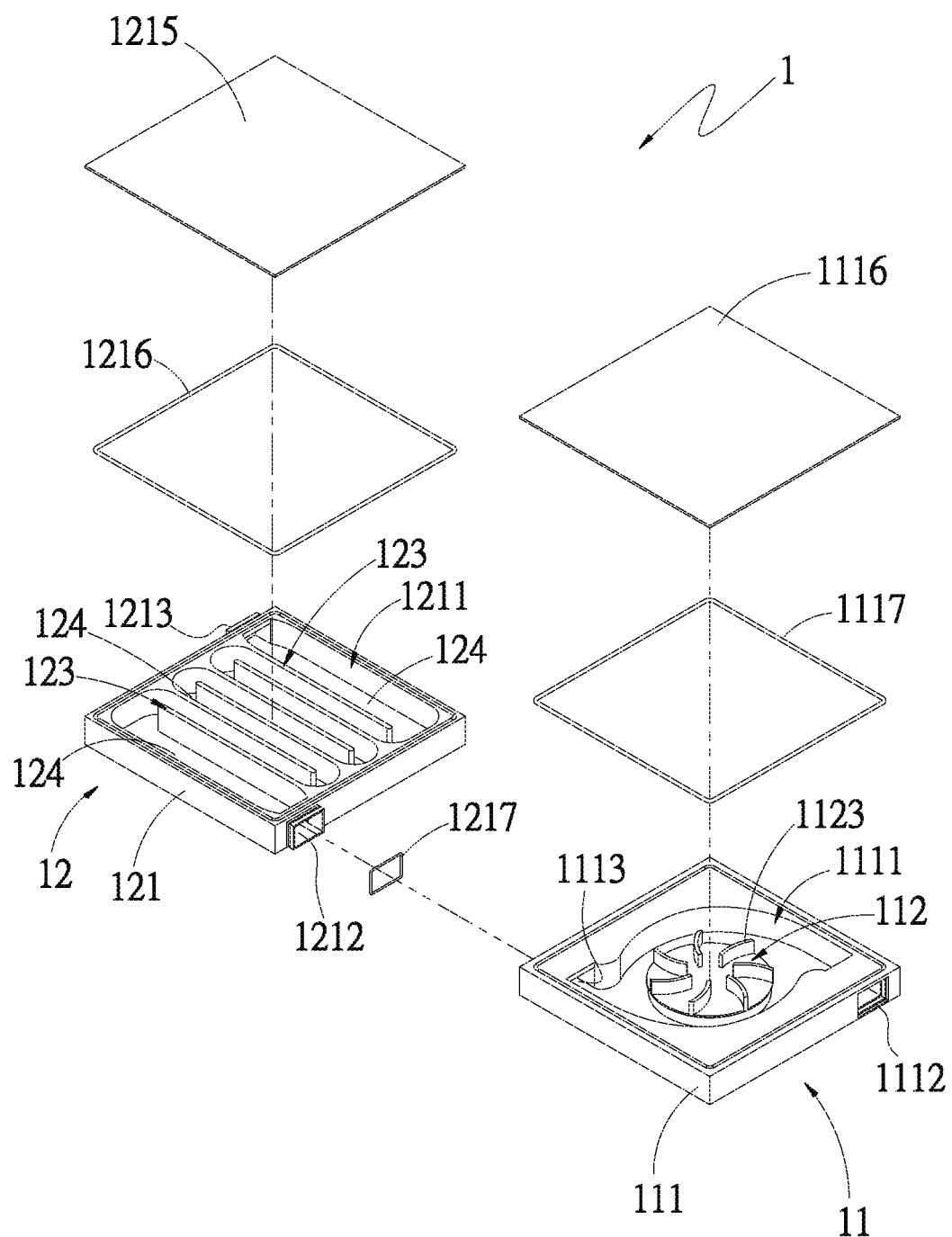
FIG. 10 is an exploded perspective view of the water cooling device according to a fifth embodiment of the present invention.
Figure 11:
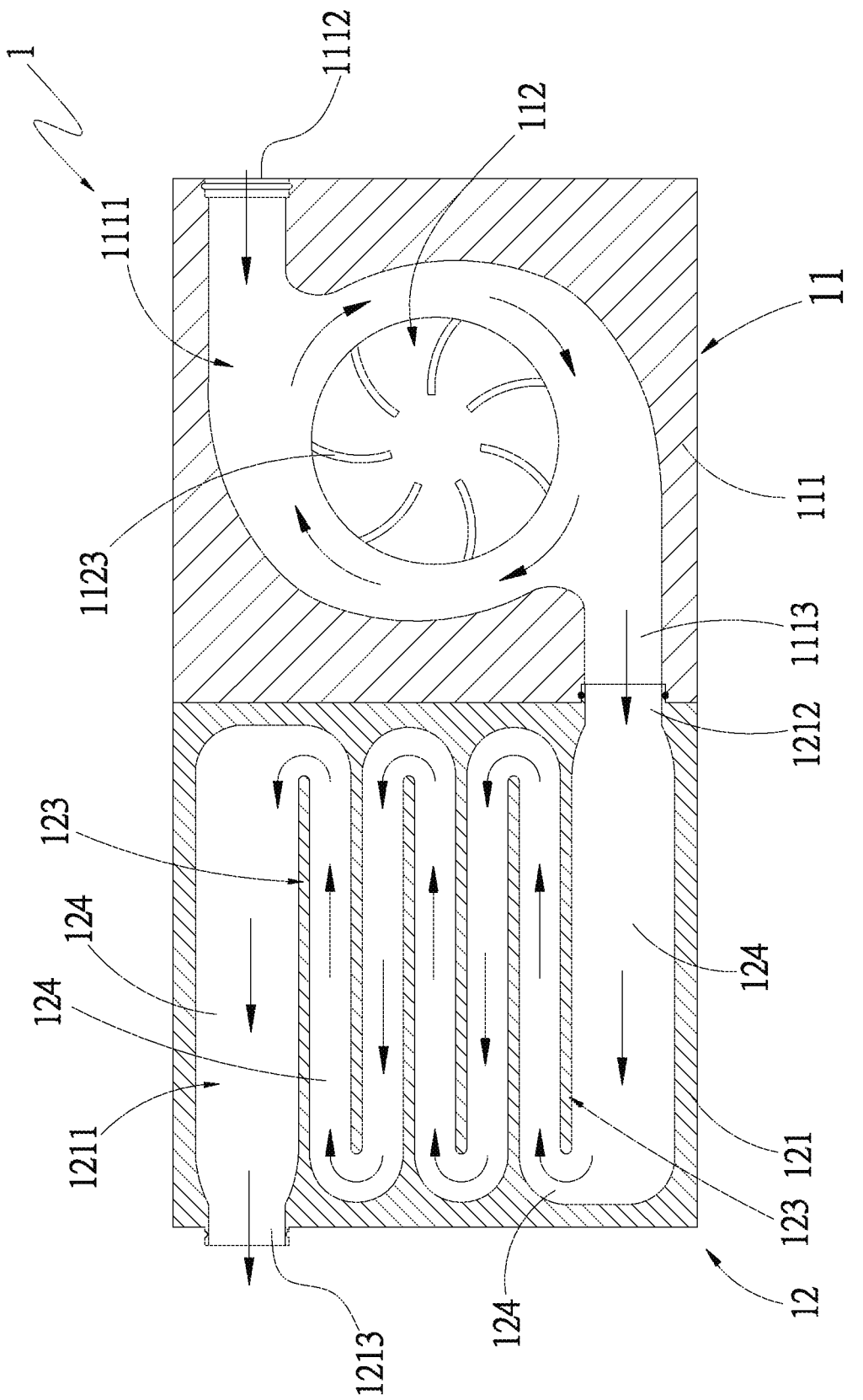
FIG. 11 is an assembled sectional top view of the water cooling device of FIG. 10.

Please refer to FIG. 10, which is an exploded perspective view of the water cooling device 1 according to a fifth embodiment of the present invention, and to FIG. 11, which is an assembled sectional top view of the water cooling device 1 of FIG. 10. The fifth embodiment of the water cooling device 1 is generally structurally similar to the first embodiment except that, in the fifth embodiment, the heat dissipation member 123 does not include heat radiation fins but is integrally formed with the liquid case 121 to locate in the heat exchange chamber 1211 between the water inlet 1212 and the water outlet 1213, so as to form a transversely extended winding passage 124 in the heat exchange chamber 1211. The passage 124 is used for guiding the cooling liquid from the water inlet 1212 to the water outlet 1213. With the winding passage 124, the cooling liquid can flow through the heat exchange chamber 1211 at a reduced speed, allowing the cooling liquid to have sufficient time for exchanging heat with the heat dissipation member 123 and provide largely improved cooling effect.

Therefore, when the bottom of the liquid case 121 is attached to a heat source, such as a CPU or a GPU, the heat produced by the heat source is absorbed by and transferred from the bottom of the liquid case 121 to the heat dissipation member 123 in the heat exchange chamber 1211. At this time, the cooling liquid flowing through the water inlet 1212 further flows along the winding passage 124 toward the water outlet 1213 to exchange heat with the heat dissipation member 123 and quickly carries the heat away from the liquid case 121 via the water outlet 1213 to achieve the cooling effect.

Figure 12:
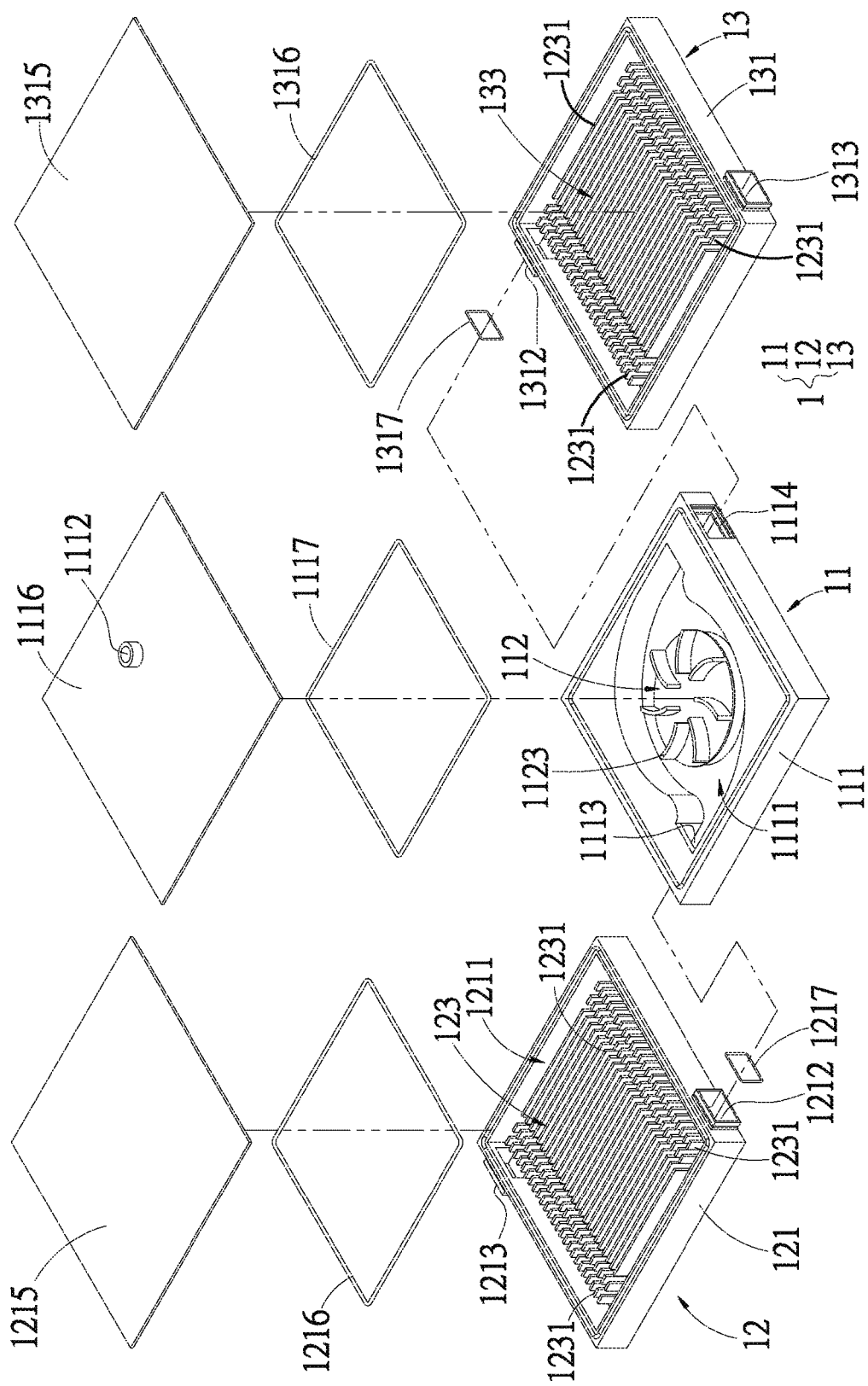
FIG. 12 is an exploded perspective view of the water cooling device according to a sixth embodiment of the present invention.
Figure 13:
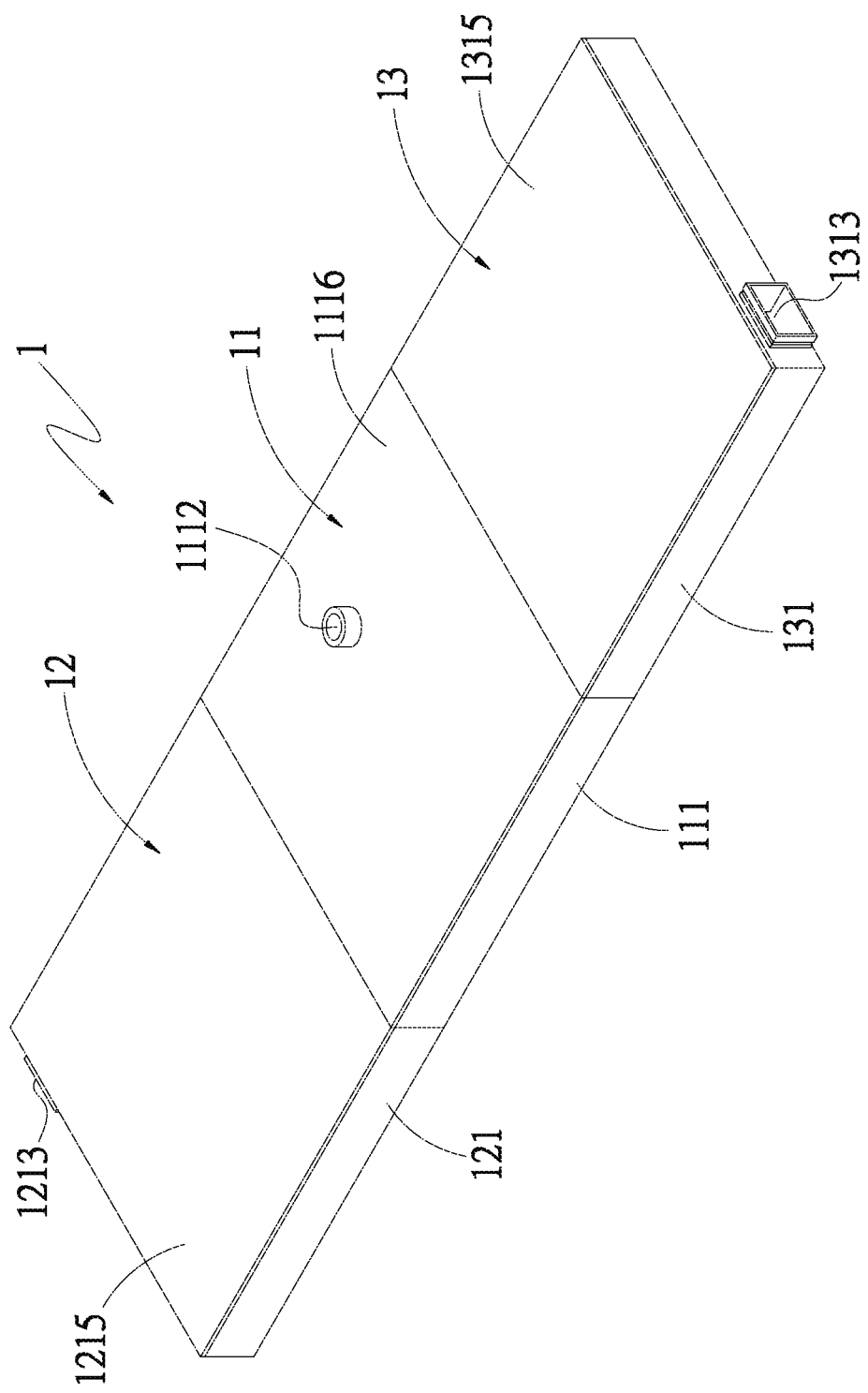
FIG. 13 is an assembled perspective view of FIG. 12.
Figure 14:
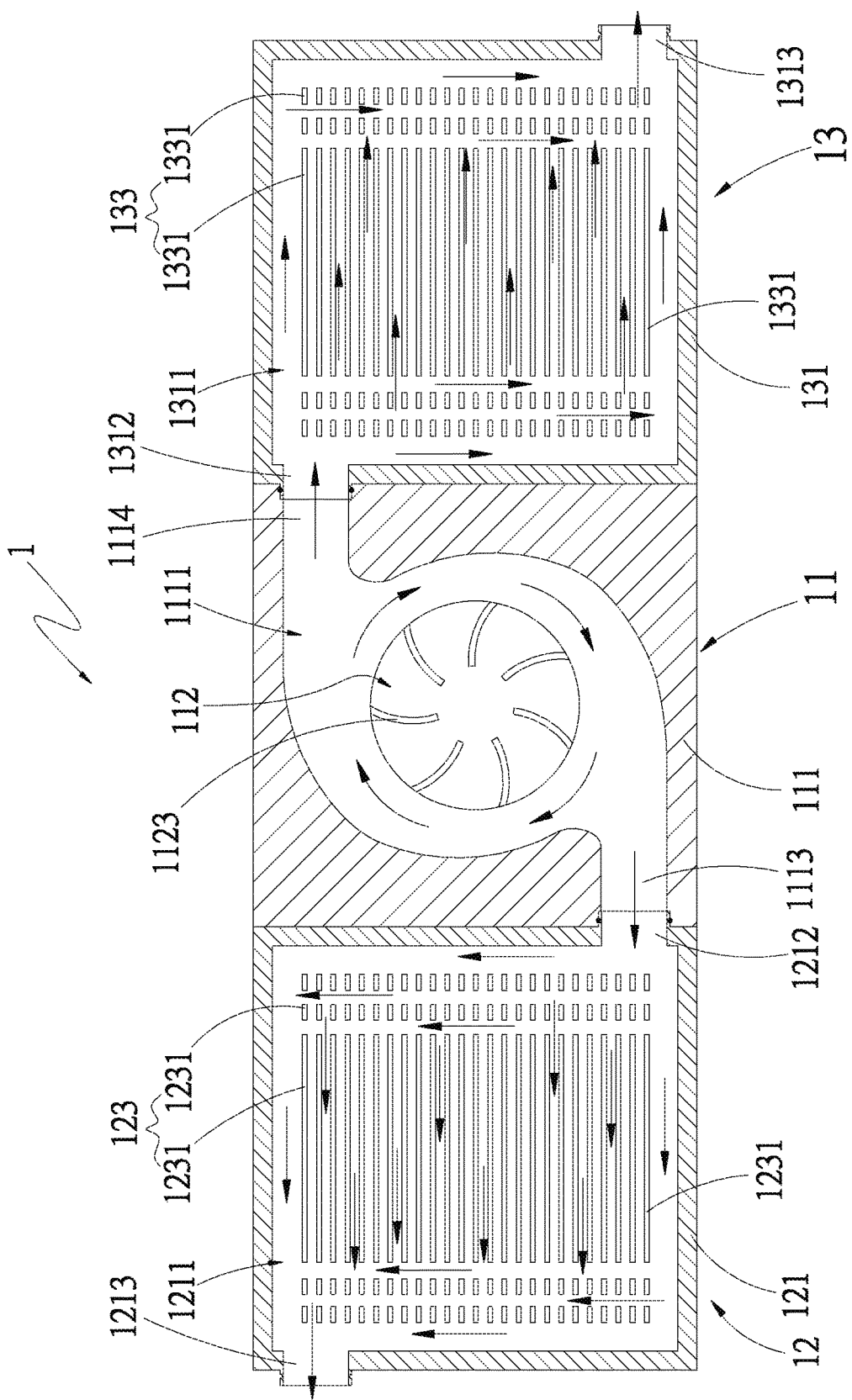
FIG. 14 is an assembled sectional top view of the water cooling device of FIG. 12.

Please refer to FIGS. 12 and 13, which are exploded and assembled perspective views, respectively, of the water cooling device 1 according to a sixth embodiment of the present invention, and to FIG. 14, which is an assembled sectional top view of the water cooling device 1 of FIG. 12. The sixth embodiment of the water cooling device 1 is generally structurally similar to the second embodiment except that, in the sixth embodiment, the pump unit 11 further includes a second outlet 1114 communicable with the inlet 1112, the first outlet 1113, and the pump chamber 1111. In the illustrated sixth embodiment, the second outlet 1114 is recessed into one side wall of the pump housing 111 opposite to the first outlet 1113, as shown in FIG. 12. The inlet 1112 is protruded upwardly from the upper side of the pump housing 111, and the first and the second outlet 1113, 1114 are recessed into two opposite side walls of the pump housing 111. However, in other embodiments, the first and the second outlet 1113, 1114 may be protruded outwardly from two opposite side walls of the pump housing 111.

Further, the water cooling device 1 in the sixth embodiment includes, in addition to the pump unit 11, a plurality of heat exchange units. The heat exchange units include a first heat exchange unit 12 and a second heat exchange unit 13. The first heat exchange unit 12 in the sixth embodiment of the water cooling device 1 is structurally identical to the heat exchange unit 12 in the first embodiment. To facilitate convenient description of the sixth embodiment, all elements included in the first heat exchange unit 12, including a first liquid case 121, a first heat dissipation member 123, a first heat exchange chamber 1211, a first water inlet 1212 and a first water outlet 1213, are correspondingly denoted by the same reference numerals as the elements included in the heat exchange unit 12 in the first embodiment, including the liquid case 121, the heat dissipation member 123, the heat exchange chamber 1211, the water inlet 1212 and the water outlet 1213.

In the sixth embodiment, all the first and second heat exchange units 12, 13 and the pump unit 11 are modularized, so that the first and second heat exchange units 12, 13 can be detachably assembled to the modularized pump unit 11. That is, the first and the second heat exchange unit 12, 13 are detachably connected to two different sides of the pump housing 111 of the pump unit 11. Furthermore, the first and the second heat exchange unit 12, 13 and the pump unit 11 are horizontally disposed side by side. The second heat exchange unit 13 includes a second liquid case 131 and a second heat dissipation member 133. The second liquid case 131 internally defines a second heat exchange chamber 1311 and has a second water inlet 1312, a second water outlet 1313, and a third top plate 1315 formed on an upper side of the second liquid case 131. In the illustrated sixth embodiment, the third top plate 1315 and the second liquid case 131 are two separate elements and can be connected to each other by scarf joining, screw locking, gluing, welding or the like. A third packing 1316 is provided between the third top plate 1315 and the second liquid case 131 to prevent the cooling liquid in the second heat exchange chamber 1311 from leaking out of the second liquid case 131. In practical implementation, however, the third top plate 1315 can be integrally formed with the second liquid case 131 to save the third packing 1316.

When the impeller 1123 rotates, it stirs the cooling liquid in the pump chamber 1111, causing the cooling liquid to flow from the inlet 1112 toward the first outlet 1113 and the second outlet 1114 into the first heat exchange unit 12 and the second heat exchange unit 13.

The second water inlet 1312 is communicable with the second heat exchange chamber 1311, the second water outlet 1313, and the second outlet 1114 of the pump housing 111. A part of the cooling liquid in the pump housing 111 flows into the first heat exchange chamber 1211 via the first outlet 1113 and the first water inlet 1212 to flow through the first heat dissipation member 123, and another part of the cooling liquid in the pump housing 111 flows into the second heat exchange chamber 1311 via the second outlet 1114 and the second water inlet 1312 to flow through the second heat dissipation member 133. Afterwards, the two parts of the cooling liquid flow out of the first and the second liquid case 121, 131 via the first and the second water outlet 1213, 1313, respectively. In the illustrated sixth embodiment, the second water inlet 1312 and the second water outlet 1313 are protruded from two opposite side walls of the second liquid case 131. However, in other embodiments, the second water inlet 1312 and the second water outlet 1313 can be differently designed.

Further, the second water inlet 1312 of the second liquid case 131 can be correspondingly detachably connected to the second outlet 1114 of the pump housing 111. That is, since the pump unit 11 and the first and the second heat exchange unit 12, 13 are modularized units, the first and the second water inlet 1212, 1312 of the first and the second heat exchange units 12, 13, can be respectively fitted or inserted into the first and the second outlet 1113, 1114 of the pump unit 11 to form the water cooling device 1. Or, the first and the second heat exchange unit 12, 13 can be detached from the pump unit 11 by pulling the first and the second heat exchange unit 12, 13 in a direction away from the pump unit 11. In the event any one of the pump unit 11 and the first and second heat exchange units 12, 13 of the water cooling device 1 is damaged, only the damaged unit, for example, the pump unit 11, is needed to be replaced. In this case, the damaged pump unit 11 can be quickly disassembled from the water cooling device 1 and then a new one can be easily assembled to the original first and second heat exchange units 12, 13 without the need of discarding the whole water cooling device 1. In this manner, the water cooling device can have largely reduced use cost and the modularized units thereof can be quickly easily replaced and reassembled.

Moreover, in other embodiments, the first water inlet 1212 and the first water outlet 1213 of the first liquid case 121 can be recessed into two opposite side walls of the first liquid case 121, and the first water inlet 1212 of the liquid case 121 is correspondingly detachably connected to the first outlet 1113 of the pump housing 111. In other words, when the first water inlet 1212 of the first liquid case 121 is recessed in form, the first outlet 1113 of the pump housing 111 must be correspondingly protruded in form, such that the first outlet 1113 of the pump housing 111 can be inserted into the first water inlet 1212 of the first liquid case 121 to connect the pump unit 11 to the first heat exchange unit 12. A first leak-proof packing 1217 is provided between the first water inlet 1212 of the first liquid case 121 and the first outlet 1113 of the pump housing 111 to prevent the cooling liquid in the pump chamber 1111 and the first heat exchange chamber 1211 from leaking out of the two chambers.

Referring to FIGS. 1 and 3A again, the first heat exchange chamber 1211 allows the cooling liquid to flow therethrough and has the first heat dissipation member 123 disposed therein. The first heat dissipation member 123 is made of a metal material, such as copper or aluminum, and has a plurality of heat radiation fins 1231. The heat radiation fins 1231 are spaced on a bottom of the first liquid case 121 in the first heat exchange chamber 1211 to provide a largely increased heat exchange area. A heat contact surface is formed on an outer surface of the first liquid case 121 for contacting with a heat source, such as a CPU or a GPU, such that heat produced by the heat source is absorbed by and transferred from the heat contact surface to the heat radiation fins 1231 in the first heat exchange chamber 1211 for exchanging heat with the cooling liquid. At this time, the cooling liquid carries the heat away from the heat radiation fins 1231 and then flows out of the first heat exchange chamber 1211 via the first water outlet 1213 of the first liquid case 121 to achieve the cooling effect.

Moreover, in other embodiments, the second water inlet 1312 and the second water outlet 1313 of the second liquid case 131 can be recessed into two opposite side walls of the second liquid case 131, and the second water inlet 1312 of the second liquid case 131 is correspondingly detachably connected to the second outlet 1114 of the pump housing 111. In other words, when the second water inlet 1312 of the second liquid case 131 is recessed in form, the second outlet 1114 of the pump housing 111 must be correspondingly protruded in form, such that the second outlet 1114 of the pump housing 111 can be inserted into the second water inlet 1312 of the second liquid case 131 to connect the pump unit 11 to the second heat exchange unit 13. A second leak-proof packing 1317 is provided between the second water inlet 1312 of the second liquid case 131 and the second outlet 1114 of the pump housing 111 to prevent the cooling liquid in the pump chamber 1111 and the second heat exchange chamber 1311 from leaking out of the two chambers at the joint of the second water inlet 1312 and the second outlet 1114.

FIG. 14 is an assembled sectional top view of the water cooling device 1 according to the sixth embodiment of the present invention. Please refer to FIGS. 12 and 14. The second heat exchange chamber 1311 allows the cooling liquid to flow therethrough and has the second heat dissipation member 133 disposed therein. The second heat dissipation member 133 is made of a metal material, such as copper or aluminum, and has a plurality of heat radiation fins 1331. The heat radiation fins 1331 are spaced on a bottom of the second liquid case 131 in the second heat exchange chamber 1311 to provide a largely increased heat exchange area. A heat contact surface is formed on an outer surface of the second liquid case 131 for contacting with another heat source, such as a CPU or a GPU, such that heat produced by the other heat source is absorbed by and transferred from the heat contact surface to the heat radiation fins 1331 in the second heat exchange chamber 1311 for exchanging heat with the cooling liquid. At this time, the cooling liquid carries the heat away from the heat radiation fins 1331 and then flows out of the second heat exchange chamber 1311 via the second water outlet 1313 of the second liquid case 131 to achieve the cooling effect.

While the heat radiation fins 1331 in the second liquid case 131, as shown in FIG. 12, are different in height, it is understood the heat radiation fins 1331 may be designed to have the same height in practical implementation of the present invention.

Since the pump unit 11 and the first and second heat exchange units 12, 13 forming the water cooling device 1 all are modularized units, different number of the first and second heat exchange units 12, 13 can be flexibly detachably assembled to the pump unit 11 according to the number of the heat sources in an electronic device that are to be cooled, such as the CPU or the GPU in a computer (not shown). That is, the water cooling device 1 of the present invention can be conveniently and quickly assembled and disassembled to enable efficient replacement of any damaged modularized unit and flexible expansion of the water cooling device.

In addition, in the present invention, the pump unit 11 and the first and second heat exchange units 12, 13 are horizontally detachably connected side by side, which largely reduces an overall height of the pump unit 11 and the first and second heat exchange units 12, 13 to effectively make the water cooling device 1 thinner.

Figure 15:
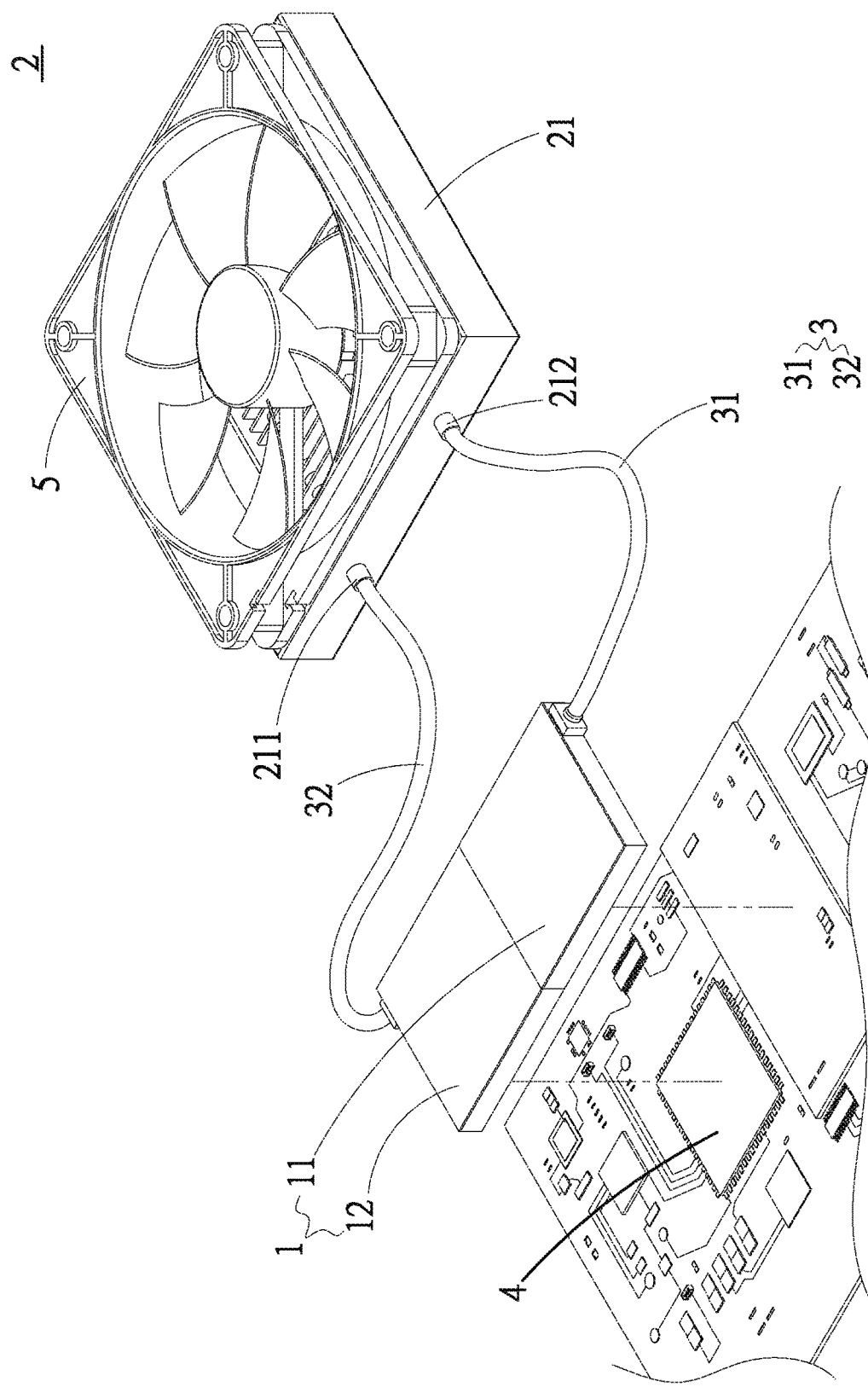
FIG. 15 is an exploded perspective view showing the water cooling device according to a seventh embodiment of the present invention and the use thereof.
Figure 16:
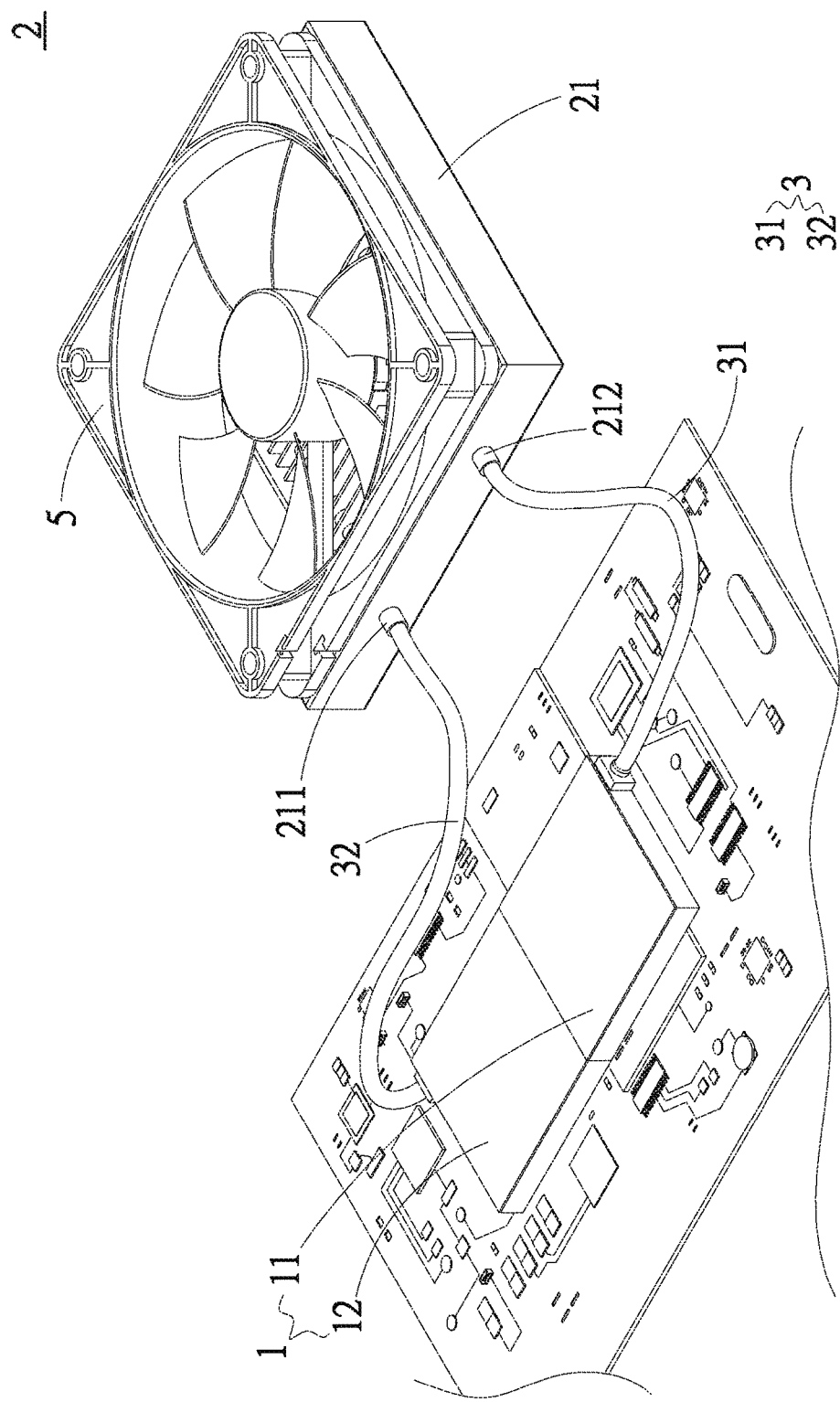
FIG. 16 is an assembled view of FIG. 15.

FIGS. 15 and 16 are exploded and assembled perspective views, respectively, showing the water cooling device 1 according to a seventh embodiment of the present invention and the use thereof. Please refer to FIGS. 15 and 16 along with FIGS. 1 and 3A. The water cooling device 1 in the seventh embodiment is identical to the water cooling device in the first embodiment but further has a heat radiator 21 connected thereto to form a water cooling system 2. That is, the water cooling system 2 includes a water cooling device 1 and a heat radiator 21. The heat radiator 21 is located at a distance from the pump unit 11 and the heat exchange unit 12 of the water cooling device 1, and is connected to the inlet 1112 of the pump unit 11 and the water outlet 1213 of the heat exchange unit 12 via a plurality of tubes 3, so as to circulate the cooling liquid in the water cooling system 2. In the illustrated seventh embodiment, the tubes 3 include a first flexible tube 31 and a second flexible tube 32. The first and the second flexible tube 31, 32 respectively have two ends. The first flexible tube 31 is connected at one end to a heat radiator outlet 212 of the heat radiator 21, and at the other end to the inlet 1112 of the pump unit 11, whereas the second flexible tube 32 is connected at one end to a heat radiator inlet 211 of the heat radiator 21, and at the other end to the water outlet 1213 of the heat exchange unit 12. With these arrangements, the pump 112 of the pump unit 11 can drive the cooling liquid to circulate in the pump unit 11, the heat exchange unit 12, and the heat radiator 21 to dissipate heat.

In addition, the heat radiator 21 may be connected to a cooling fan 5 to facilitate quick heat dissipation from the heat radiator 21 into ambient air. When the bottom of the liquid case 121 is attached to a heat-generating element 4, i.e. a heat source, the heat produced by the heat-generating element 4 is absorbed by and transferred from the liquid case 121 to the heat radiation fins 1231 in the heat exchange chamber 1211 for exchanging heat with the cooling liquid in the heat exchange chamber 1211. Then, the heat-carrying cooling liquid flows out of the heat exchange chamber 1211 via the water outlet 1213 of the liquid case 121 into the heat radiator 21 via the second flexible tube 32. The cooling liquid flowing through the heat radiator 21 is cooled before it flows through the heat radiation outlet 212 and the first flexible tube 31 into the pump chamber 1111 via the inlet 1112 of the pump housing 111. At the same time, the impeller 1123 in the pump chamber 1111 stirs and drives the cooling liquid in the pump chamber 1111 to flow out of the pump unit 11 via the first outlet 1113 and then, into the heat exchange chamber 1211 via the water inlet 1212 of the liquid case 121. By circulating the cooling liquid in the above-described manner, the heat produced by the heat-generating element 4 can be effectively removed.

In the water cooling system 2, since the pump unit 11 and the heat exchange unit 12 forming the water cooling device 1 all are modularized units, different number of the heat exchange units 12 can be flexibly detachably assembled to the pump unit 11 according to the number of the heat sources in an electronic device that are to be cooled, such as the CPU or the GPU in a computer (not shown). That is, the water cooling device 1 of the present invention can be conveniently and quickly assembled and disassembled to enable efficient replacement of any damaged modularized unit and flexible expansion of the water cooling device. In addition, in the present invention, the pump unit 11 and the heat exchange unit 12 are horizontally positioned side by side, which largely reduces an overall height of the pump unit 11 and the heat exchange unit 12 to effectively make the water cooling device 1 thinner.

Figure 17:
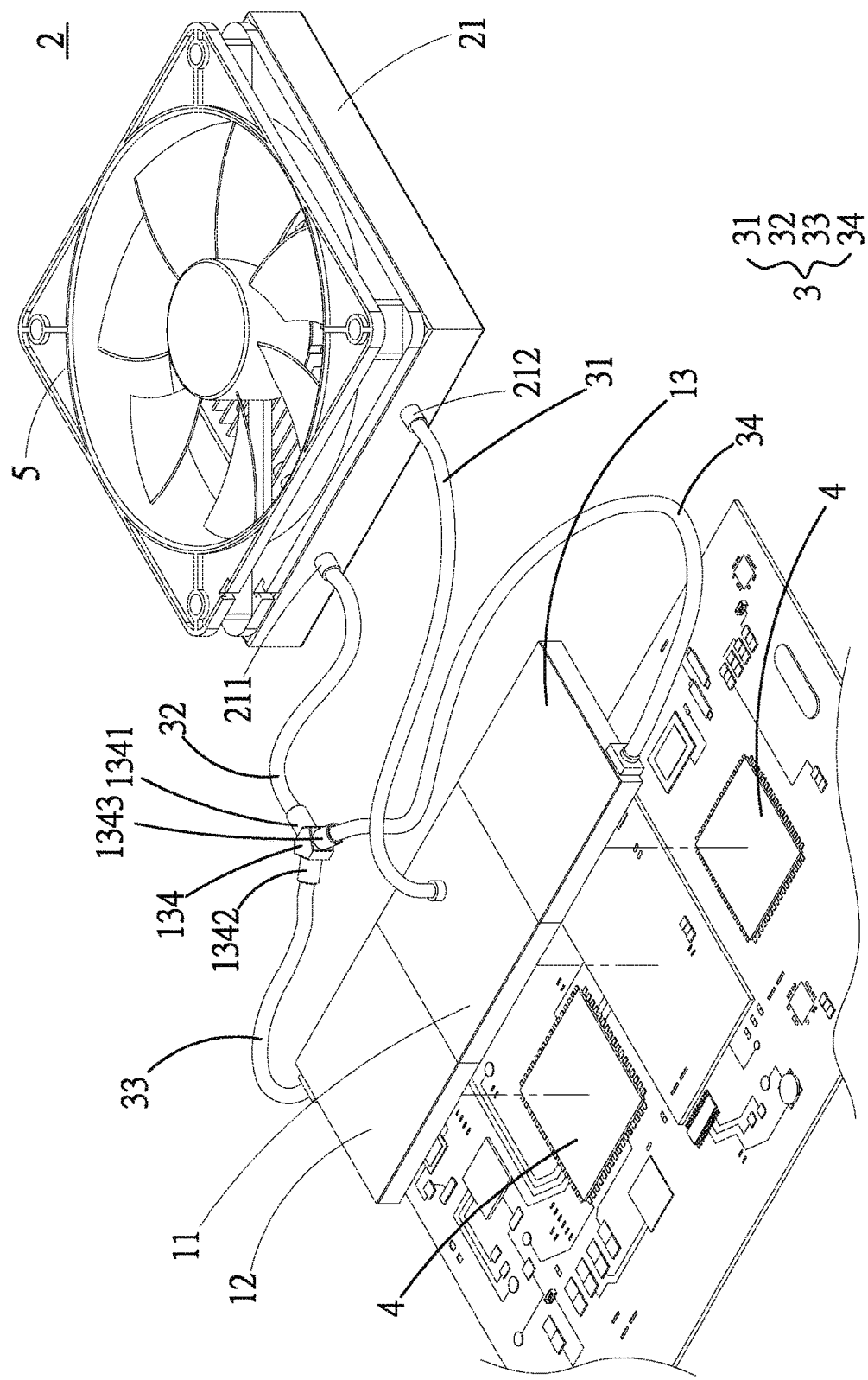
FIG. 17 is an exploded perspective view showing the water cooling device according to an eighth embodiment of the present invention and the use thereof.
Figure 18:
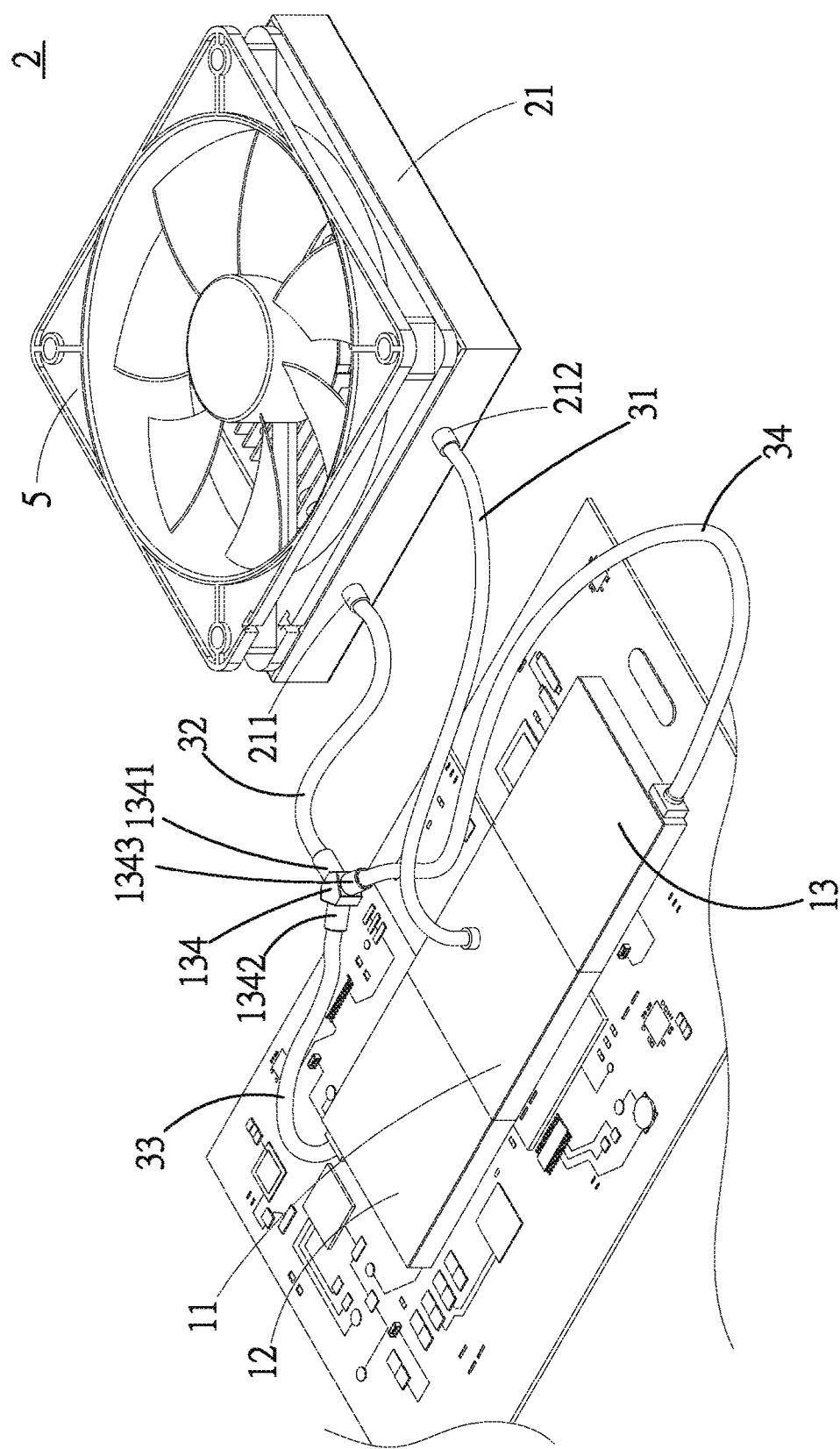
FIG. 18 is an assembled view of FIG. 17.

FIGS. 17 and 18 are exploded and assembled perspective views, respectively, showing the water cooling device 1 according to an eighth embodiment of the present invention and the use thereof. Please refer to FIGS. 17 and 18 along with FIGS. 12 and 14. The water cooling device 1 in the eighth embodiment is identical to the water cooling device 1 in the sixth embodiment but has a heat radiator 21 connected thereto to form a water cooling system 2. That is, the water cooling system 2 includes a water cooling device 1 and a heat radiator 21. The heat radiator 21 is located at a distance from the pump unit 11 and the first and second heat exchange units 12, 13 of the water cooling device 1, and is connected to the inlet 1112 of the pump unit 11 and the first and second water outlets 1213, 1313 of the first and second heat exchange units 12, 13 via a plurality of tubes 3, so as to circulate the cooling liquid in the water cooling system 2 to achieve the purpose of heat dissipation.

In the illustrated eighth embodiment, the tubes 3 are four in number, including a first to a fourth flexible tube 31-34. The first flexible tube 31 is connected at an end to a heat radiator outlet 212 of the heat radiator 21, and at another end to the inlet 1112 of the pump unit 11. The second flexible tube 32 has an end connected to a heat radiator inlet 211 of the heat radiator 21, and another end communicably connected to a first end 1341 of a union tee 134. The third flexible tube 33 is communicably connected at an end to the first water outlet 1213 of the first heat exchange unit 12, and at another end to a second end 1342 of the union tee 134.

And, the fourth flexible tube 34 is communicably connected at and end to a third end 1343 of the union tee 134, and at another end to the second water outlet 1313 of the second heat exchange unit 13. With these arrangements, the pump 112 of the pump unit 11 can drive the cooling liquid to circulate in the pump unit 11, the first and second heat exchange units 12, 13 and the heat radiator 21 to dissipate heat.

In practical implementation, the heat radiator 21 may have two heat radiator inlets provided thereon, such that only two flexible tubes are needed to directly communicably connect the first and the second heat exchange unit 12, 13 to the two heat radiator inlets. Thus, the union tee and one flexible tube can be saved. Moreover, the two heat contact surfaces formed at the bottoms of the first and second liquid cases 121, 131 of the first and second heat exchange units 12, 13 can be correspondingly attached to two heat-generating elements 4.

In addition, the heat radiator 21 may be connected to a cooling fan 5 to facilitate quick heat dissipation from the heat radiator 21 into ambient air. The cooling liquid in the first and the second heat exchange chamber 1211, 1311 exchanges heat with the heat radiation fins 1231, 1331, and then flows out of the first and the second heat exchange unit 12, 13 via the first and the second water outlet 1213, 1313 into the third and the fourth flexible tube 33, 34. Two streams of the cooling liquid flowing through the third and the fourth flexible tube 33, 34 further flow through the second and the third end 1342, 1343 of the union tee 134, respectively, to converge in the union tee 134. Finally, the cooling liquid flows through the first end 1341 of the union tee 134 into the second flexible tube 32 before flowing into the heat radiator 21 via the heat radiator inlet 211. The cooling liquid flowing through the heat radiator 21 is cooled before it flows through the heat radiation outlet 212 and the first flexible tube 31 into the pump chamber 1111 via the inlet 1112 of the pump housing 111. At the same time, the impeller 1123 in the pump chamber 1111 stirs and drives the cooling liquid in the pump chamber 1111 to flow out of the pump unit 11 via the first and second outlets 1113, 1114 and then into the first and second heat exchange chambers 1211, 1311 via the first and second water inlets 1212, 1312 of the first and second liquid cases 121, 131. By circulating the cooling liquid in the above-described manner, the heat produced by the two heat-generating elements 4 can be effectively removed.

In the water cooling system 2, since the pump unit 11 and the first and second heat exchange units 12, 13 forming the water cooling device 1 all are modularized units, different number of the first and second heat exchange units 12, 13 can be flexibly detachably assembled to the pump unit 11 according to the number of the heat sources in an electronic device that are to be cooled, such as the CPU or the GPU in a computer (not shown). That is, the water cooling device 1 of the present invention can be conveniently and quickly assembled and disassembled to enable efficient replacement of any damaged modularized unit and flexible expansion of the water cooling device.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A water cooling device with detachably assembled modularized units for application to electronic devices comprising at least one pump unit and at least one heat exchange unit; and the pump unit and the heat exchange unit being modularized for the heat exchange unit to be detachably assembled to the pump unit wherein the heat exchange unit and the pump unit are horizontally positioned side by side; the heat exchange unit having a liquid case and a heat dissipation member; the liquid case internally defining a heat exchange chamber and having a water inlet and a water outlet; the water inlet being communicable with the heat exchanger chamber and the water outlet; the water inlet being further in contact with the pump unit and designed for detachably connecting to the pump unit; the heat exchanger chamber being designed for the cooling liquid to pass through; and the heat dissipation member being provided in the heat exchange chamber, wherein the pump unit includes a pump housing and a pump; the pump housing internally defining a pump chamber and having an inlet and a first outlet communicable with the pump chamber; the pump chamber being designed for a cooling liquid to pass therethrough; and the pump being positioned in the pump chamber and submerged in the cooling liquid to circulate the cooling liquid in the pump chamber.

2. The water cooling device as claimed in claim 1, wherein the pump has a stator and a rotor; the rotor being connected to an impeller that is exposed to the cooling liquid in the pump chamber.

3. The water cooling device as claimed in claim 1, wherein the heat dissipation member has a plurality of heat radiation fins-arrayed on a bottom of the liquid case to space from one another in the heat exchange chamber.

4. The water cooling device as claimed in claim 3, wherein each of the heat radiation fins has a plurality of through holes formed thereon; the through holes being communicable with the heat exchange chamber and extended through the heat radiation fins in a thickness direction thereof, and the through holes on every heat radiation fin being communicable with one another.

5. The water cooling device as claimed in claim 1, wherein the heat dissipation member has a plurality of heat radiation posts arrayed on a bottom of the liquid case to space from one another in the heat exchange chamber.

6. The water cooling device as claimed in claim 1, wherein the heat dissipation member is integrally formed with the liquid case to locate in the heat exchange chamber between the water inlet and the water outlet, so as to form a transversely extended winding passage in the heat exchange chamber for guiding the cooling liquid from the water inlet to the water outlet.

7. The water cooling device as claimed in claim 1, wherein the pump unit further includes a second outlet communicable with the inlet, the first outlet and the pump chamber, and there are a first and a second modularized heat exchange unit included in the water cooling device; the first and the second heat exchange unit being designed for detachably assembled to the pump unit; and each of the first and the second heat exchange unit being horizontally connected to the pump unit side by side.

8. The water cooling device as claimed in claim 7, wherein the first heat exchange unit has a first liquid case and a first heat dissipation member, and the second heat exchange unit has a second liquid case and a second heat dissipation member;

the first liquid case internally defining a first heat exchange chamber and having a first water inlet and a first water outlet; the first water inlet being communicable with the first heat exchange chamber, the first water outlet and the first outlet; the first water inlet being designed for correspondingly detachably connected to the first outlet of the pump unit; the first heat exchange chamber being designed for the cooling liquid to pass therethrough; and the first heat dissipation member being provided in the first heat exchange chamber; and the second liquid case internally defining a second heat exchange chamber and having a second water inlet and a second water outlet; the second water inlet and the second water outlet being communicable with the second heat exchange chamber; the second water inlet being designed for correspondingly detachably connected to the second outlet of the pump unit; the second heat exchange chamber being designed for the cooling liquid to pass therethrough; and the second heat dissipation member being provided in the second heat exchange chamber.

9. The water cooling device as claimed in claim 8, wherein the first and the second heat dissipation member respectively have a plurality of heat radiation fins, which are arrayed on bottoms of the first and the second liquid case to space from one another in the first and the second heat exchange chamber.

10. The water cooling device as claimed in claim 1, wherein the pump unit and the heat exchange unit are connected to a heat radiator via a plurality of tubes, so that the cooling liquid can flow through the tubes into the heat radiator and be cooled.

\* \* \* \* \*